(12) United States Patent
Sugita et al.

(10) Patent No.: US 10,074,549 B2
(45) Date of Patent: Sep. 11, 2018

(54) METHOD FOR ACQUIRING DATA INDICATING ELECTROSTATIC CAPACITANCE

(71) Applicant: TOKYO ELECTRON LIMITED, Tokyo (JP)

(72) Inventors: Kippei Sugita, Miyagi (JP); Tomohide Minami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/465,056

(22) Filed: Mar. 21, 2017

(65) Prior Publication Data
US 2017/0278735 A1 Sep. 28, 2017

(30) Foreign Application Priority Data

Mar. 28, 2016 (JP) .................................. 2016-063649
Jun. 1, 2016 (JP) .................................. 2016-110095

(51) Int. Cl.
*G01R 27/26* (2006.01)
*H01L 21/67* (2006.01)
*H01L 21/677* (2006.01)
*H01L 21/683* (2006.01)
*G01D 5/24* (2006.01)

(52) U.S. Cl.
CPC ......... *H01L 21/67253* (2013.01); *G01D 5/24* (2013.01); *H01L 21/67748* (2013.01); *H01L 21/6833* (2013.01)

(58) Field of Classification Search
CPC ......... H01L 21/67253; H01L 21/67748; H01L 21/6833; G01D 5/24

USPC .......................................... 324/671, 654, 658
See application file for complete search history.

(56) References Cited

U.S. PATENT DOCUMENTS

| 6,734,027 B2 | 5/2004 | Jonkers |
| 7,884,622 B2 | 2/2011 | Doki et al. |
| 8,004,293 B2 * | 8/2011 | White ................. C23C 16/4585 324/522 |
| 9,268,739 B2 * | 2/2016 | Akada ............... H01L 21/67253 |
| 9,841,395 B2 * | 12/2017 | Sugita .................... G01N 27/24 |

FOREIGN PATENT DOCUMENTS

| JP | 4251814 B2 | 4/2009 |
| JP | 4956328 B2 | 6/2012 |

* cited by examiner

*Primary Examiner* — Reena Aurora
(74) *Attorney, Agent, or Firm* — Rothwell, Figg, Ernst & Manbeck, P.C.

(57) ABSTRACT

In a method for acquiring data indicating an electrostatic capacitance between a focus ring and a measuring device includes a disc-shaped base substrate, sensor units arranged along an edge of the base substrate and a circuit substrate mounted on the base substrate, a processor acquires one or more first data sets respectively including a plurality of digital values indicating an electrostatic capacitance of a corresponding sensor unit. The measuring device is transferred to a region on the mounting table surrounded by the focus ring. The processor acquires second data sets when one or more digital values or an average of the digital values included in each of said one or more first data sets exceeds a first threshold. The processor stores measurement data including the respective second data sets or averages of the digital values of each of the second data sets. The measuring device is unloaded from the chamber.

5 Claims, 15 Drawing Sheets

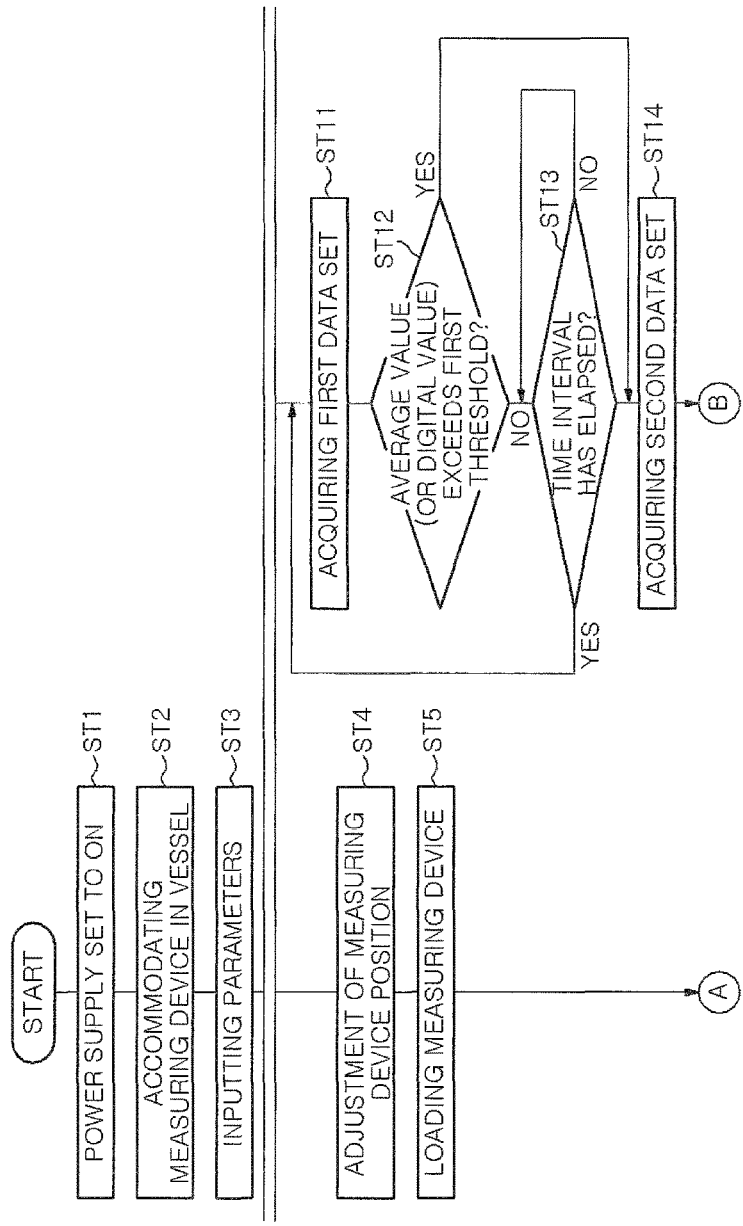

METHOD FOR ACQUIRING DATA INDICATING ELECTROSTATIC CAPACITANCE

CROSS-REFERENCE TO RELATED APPLICATIONS

This application claims priority to Japanese Patent Application No. 2016-063649 filed on Mar. 28, 2016, and Japanese Patent Application No. 2016-110095 filed on Jun. 1, 2016, the entire contents of which are incorporated herein by reference.

FIELD OF THE INVENTION

The disclosure relates to a method for acquiring data indicating an electrostatic capacitance between a focus ring and a measuring device transferred into a chamber by a transfer unit of a processing system.

BACKGROUND OF THE INVENTION

When electronic devices such as semiconductor devices are manufactured, a processing system including a process module for processing a workpiece is used. The process module generally includes a chamber main body and a mounting table. The processing system further includes a transfer unit. The workpiece is loaded by the transfer unit into a chamber provided by the chamber main body and mounted on the mounting table. The workpiece is processed in the chamber.

A position of the workpiece on the mounting table is an important factor to satisfy various demands such as in-plane processing uniformity of the workpiece and the like. Therefore, the transfer unit needs to transfer the workpiece to an appropriate position on the mounting table. When the workpiece is transferred to an inappropriate position, coordinate information that specifies a transfer destination of the transfer unit needs to be corrected.

In order to correct the coordinate information, the position of the workpiece on the mounting table needs to be detected. Conventionally, a measuring device for measuring an electrostatic capacitance is used for detecting the position. The detection using the measuring device is disclosed in Japanese Patent No. 4956328. The measuring device disclosed in Japanese Patent No. 4956328 is configured to wirelessly transmit a measured electrostatic capacitance to a control unit provided at an outside of a chamber.

In addition, Japanese Patent No. 4251814 discloses therein a wireless sensor provided in a chamber of a process module and configured to wirelessly transmit data measured during processing to a receiver provided at an outside of the chamber.

SUMMARY OF THE INVENTION

A chamber main body is generally made of a metal and, thus, wireless communication between a measuring device provided in a chamber and a device provided outside the chamber cannot be performed. Therefore, the measuring device in the chamber needs to autonomously acquire measurement data and store the measurement data. The measuring device requires a power supply such as a battery in order to perform the autonomous operation. Power consumption of the power supply needs to be reduced.

In accordance with an aspect, there is provided a method for acquiring data indicating an electrostatic capacitance between a focus ring and a measuring device transferred into a chamber by a transfer unit of a processing system. The processing system includes: a process module including a chamber main body that defines the chamber and a mounting table provided in the chamber and on which the measuring device is mounted; the transfer unit; and a control unit configured to control the transfer unit.

The measuring device includes: a disc-shaped base substrate; a plurality of sensor units arranged along an edge of the base substrate; and a circuit substrate mounted on the base substrate. Each of the sensor units includes: a sensor electrode having a front surface extending along the edge of the base substrate. The circuit substrate includes: a high frequency oscillator configured to generate a high frequency signal and electrically connected to the sensor electrode of each of the sensor units; a plurality of C/V conversion circuits each of which is configured to convert voltage amplitude at the sensor electrode of a corresponding sensor unit among the sensor units to voltage signal indicating an electrostatic capacitance; an A/D converter configured to convert the voltage signal outputted from each of the C/V conversion circuits to a digital value; a processor connected to the A/D converter; a storage device connected to the processor; a communication device configured to wirelessly transmit data stored in the storage device; and a power supply configured to supply power to the processor, the high frequency oscillator, and the communication device.

In the method, the processor is allowed to acquire one or more first data sets at a preset interval. Each of said one or more first data sets includes a plurality of digital values obtained by acquiring a digital value indicating an electrostatic capacitance of a corresponding sensor unit among the sensor units at a first sampling cycle. The transfer unit is allowed to transfer the measuring device to a region on the mounting table which is surrounded by the focus ring. The processor is allowed to acquire a plurality of second data sets during a measurement period when one or more of the digital values included in each of said one or more first data sets or an average of the digital values included in each of said one or more first data sets exceeds a first threshold value. Each of the second data sets includes a plurality of digital values obtained by acquiring a digital value indicating an electrostatic capacitance of a corresponding sensor unit among the sensor units at a second sampling cycle during the measurement period. The processor is allowed to store measurement data in the storage device. The measurement data includes the second data sets or a plurality of averages obtained by calculating an average of the digital values included in each of the second data sets. The transfer unit is allowed to unload the measuring device from the chamber.

In the method, there is used the measuring device 100 including a plurality of electrodes arranged along the edge of the disc-shaped base structure, and the measurement data that reflects the circumferential distribution of the gap between the inner periphery of the focus ring and the edge of the measuring device is obtained. The digital values indicating the electrostatic capacitances of the electrodes are increased when the measuring device is disposed in the region surrounded by the focus ring. In the method, the measurement data is not constantly measured. Before the measurement period, one or more first data sets are acquired at the time interval. When one or more of the digital values included in each of one or more first data sets or the average of the digital values included in each of one or more first data sets exceeds the first threshold, the second data set is acquired during the measurement period and the measurement data is stored. In the method, the measuring device intermittently operates before the measurement period, so that the power consumption of the power supply of the measuring device is decreased.

In the method, the processor may be allowed to acquire one or more third data sets at a preset time interval after the measurement period is completed, each of said one or more third data sets including a plurality of digital values obtained by acquiring a digital value indicating an electrostatic capacitance of a corresponding sensor unit among the sensor units at a third sampling cycle. The processor is allowed to wirelessly transmit the measurement data to the communication device when one or more of the digital values included in each of said one or more third data sets or an average of the digital values included in each of said one or more third data sets exceeds a second threshold value.

The measuring device unloaded from the chamber is accommodated in a container called a FOUP. The capacitance of the sensor electrodes of the plurality of sensor units increases when the measuring device is in the container. Therefore, when one or more of the digital values included in each of one or more third data sets or the average of the digital values included in each of one or more third data sets exceeds the second threshold Th2, the measurement data is wirelessly transmitted to the communication device. Accordingly, the measuring device when disposed in the outside of the chamber can wirelessly transmit the measurement data autonomously. Further, the measuring device intermittently operates even after the measurement period. Accordingly, the power consumption of the power supply of the measuring device 100 is further decreased.

The supply of the power from the power supply to the high frequency oscillator may be stopped between a period in which said one or more first data sets are acquired and a next period in which said one or more first data sets are acquired. Further, the supply of the power from the power supply to the high frequency oscillator may be stopped between a period in which said one or more third data sets are acquired and a next period in which said one or more third data sets are acquired.

In said transferring the measuring device, the control unit controls the transfer unit to transfer the measuring device to a transfer destination specified by preset coordinate information. The control unit is allowed to correct the coordinate information such that a circumferential variation of a gap between the focus ring and an edge of the measuring device, which is specified by the measurement data, is reduced.

As described above, when the measurement data indicating the electrostatic capacitance between the measuring device and the focus ring is acquired, the power consumption of the measuring device can be reduced.

BRIEF DESCRIPTION OF THE DRAWINGS

The objects and features of the disclosure will become apparent from the following description of embodiments, given in conjunction with the accompanying drawings, in which:

FIGS. 1A and 1B are a flowchart showing a method for measuring an electrostatic capacitance according to an embodiment;

DETAILED DESCRIPTION OF THE EMBODIMENTS

Figure 1B:
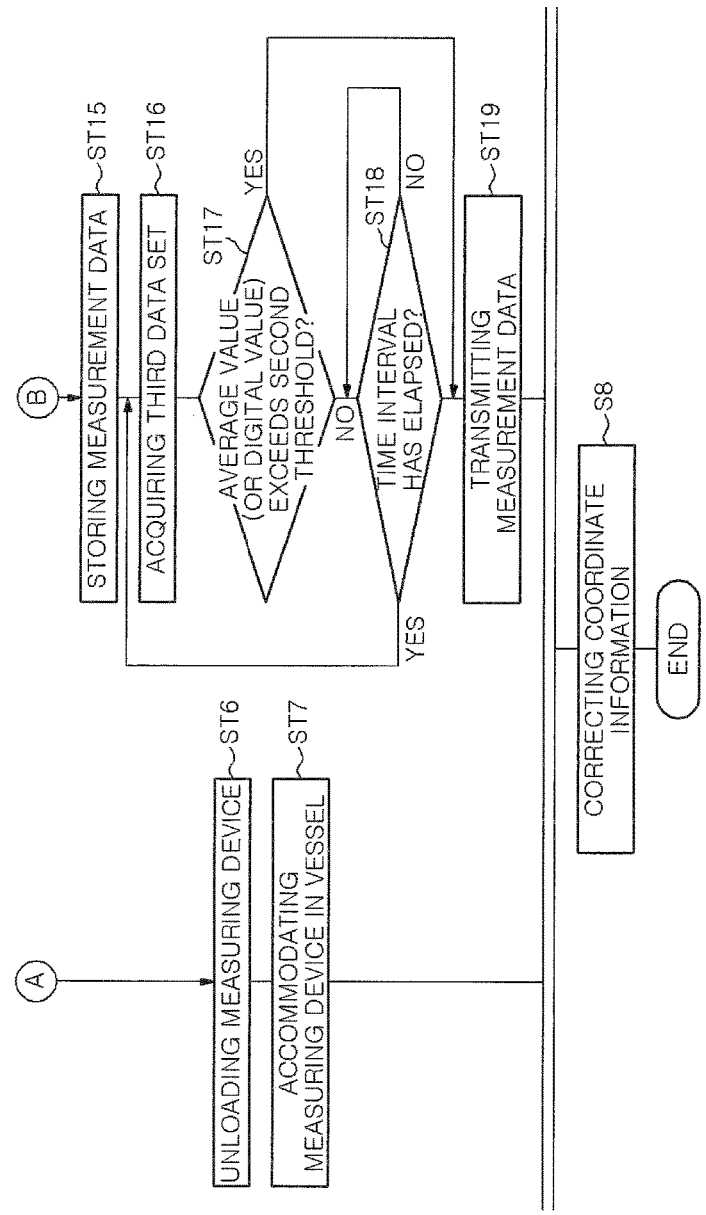

Hereinafter, various embodiments will be described in detail with reference to the accompanying drawings. Further, like reference numerals will be used for like or corresponding parts throughout the drawings.

FIGS. 1A and 1B are a flowchart of a method for measuring an electrostatic capacitance according to an embodiment. A method MT shown in FIGS. 1A and 1B is a method for acquiring data indicating an electrostatic capacitance between a focus ring and a measuring device transferred into a chamber by a transfer unit of a processing system. In the method MT according to the embodiment, coordinate information of a transfer destination of the transfer unit is corrected by using the acquired data.

Figure 2:
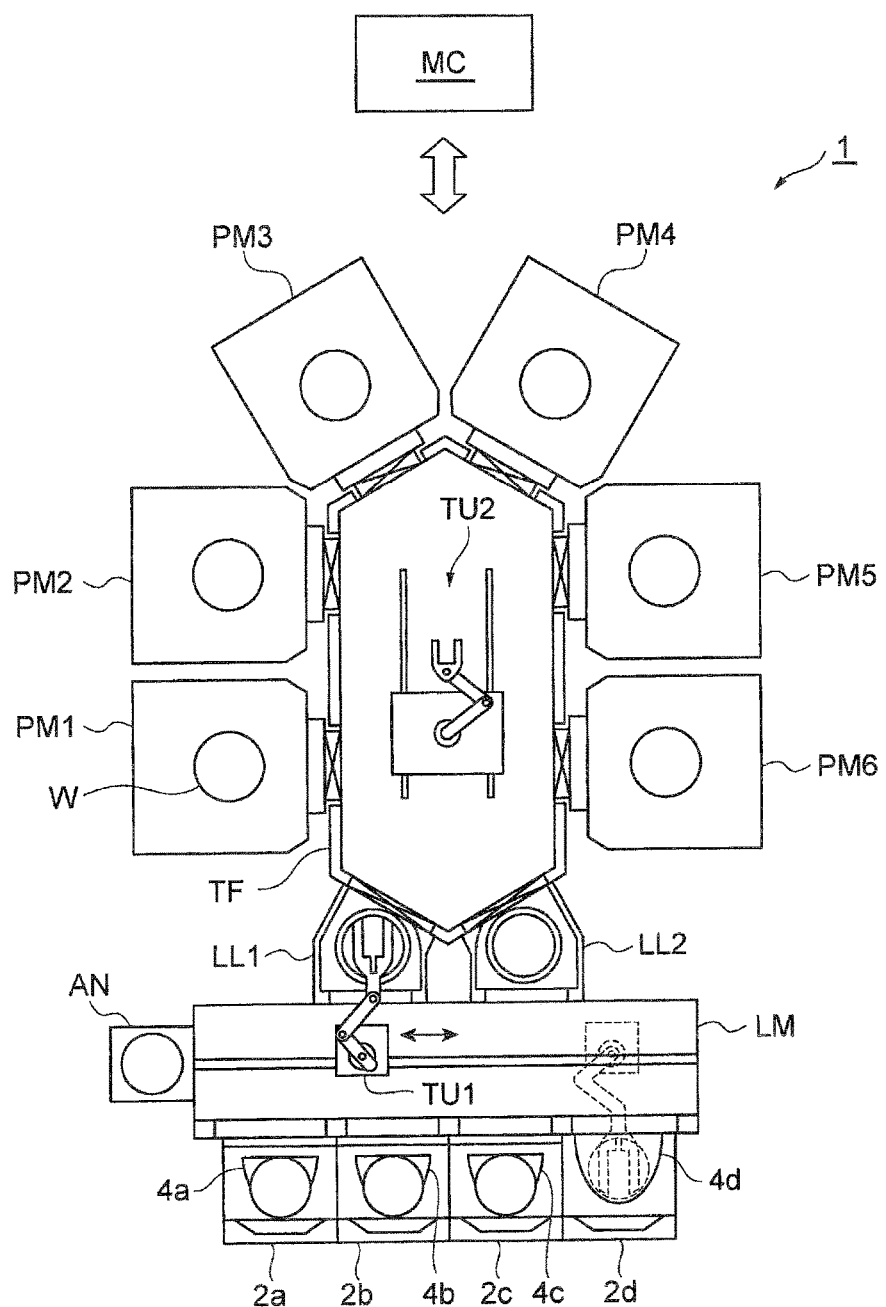
FIG. 2 shows an example of a processing system.

FIG. 2 shows an example of a processing system. A processing system 1 shown in FIGS. 1A and 1B is a processing system to which the method MT can be applied. The processing system 1 includes tables 2a to 2d, vessels 4a to 4d, a loader module LM, an aligner AN, load-lock modules LL1 and LL2, process modules PM1 to PM6, a transfer module TF, and a control unit MC. The number of the tables 2a to 2d, the number of the vessels 4a to 4d, the number of the load-lock modules LL1 and LL2, and the number of the process modules PM1 to PM6 are not limited and may be one or more.

The tables 2a to 2d are arranged along one side of the loader module LM. The vessels 4a to 4d are mounted on the tables 2a to 2d, respectively. Each of the vessels 4a to 4d is referred to as, e.g., a FOUP (Front Opening Unified Pod). Each of the vessels 4a to 4d is configured to accommodate a workpiece W. The workpiece W has a substantially disk shape.

Figure 3:
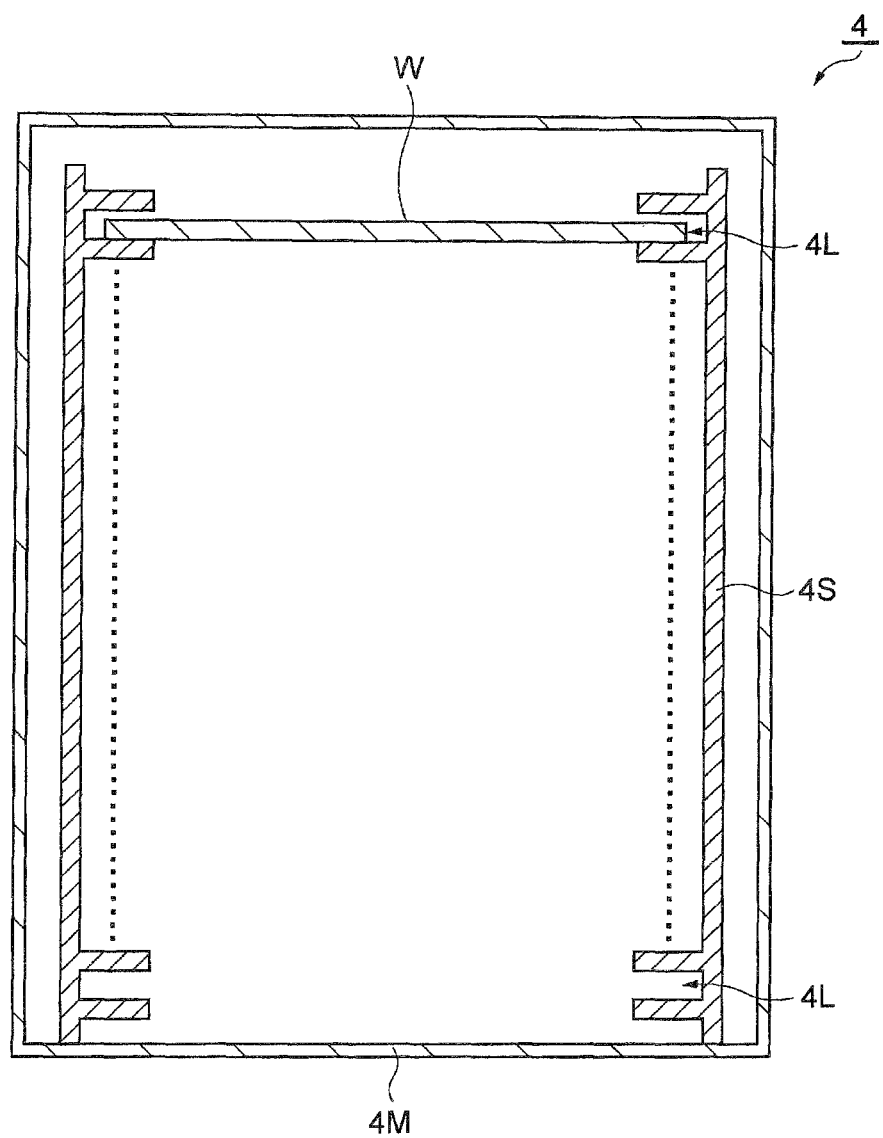
FIG. 3 is a cross sectional view showing an example of a vessel.

FIG. 3 is a cross sectional view showing an example of a vessel. FIG. 3 shows a vertical cross section of the vessel 4 that may be employed as each of the vessels 4a to 4d. As shown in FIG. 3, the vessel 4 includes a vessel main body 4M and a pair of supporting members 4S. The vessel main body 4M provides a space therein. The supporting members 4S are provided along a pair of sidewalls of the vessel main body 4M in the space provided by the vessel main body 4M. The supporting members 4S provide a plurality of slots 4L. The slots 4L are arranged in a vertical direction and extends in a depth direction, e.g., a direction perpendicular to the vertical direction, of the space provided by the vessel main body 4M. The workpiece W may be accommodated in each of the slots 4L. The workpiece W accommodated in any of the slots 4L is supported by the supporting members 4S.

Referring back to FIG. 2, the loader module LM has a chamber wall that defines therein a transfer space in an atmospheric state. In the transfer space, a transfer unit TU1 is provided. The transfer unit TU1 is, e.g., a multi-joint robot, and is controlled by a control unit MC. The transfer unit TU1 is configured to transfer the workpiece W between the vessels 4a to 4d and the aligner AN, between the aligner AN and the load-lock modules LL1 and LL2, and between the load-lock modules LL1 and LL2 and the vessels 4a to 4d.

Figure 4:
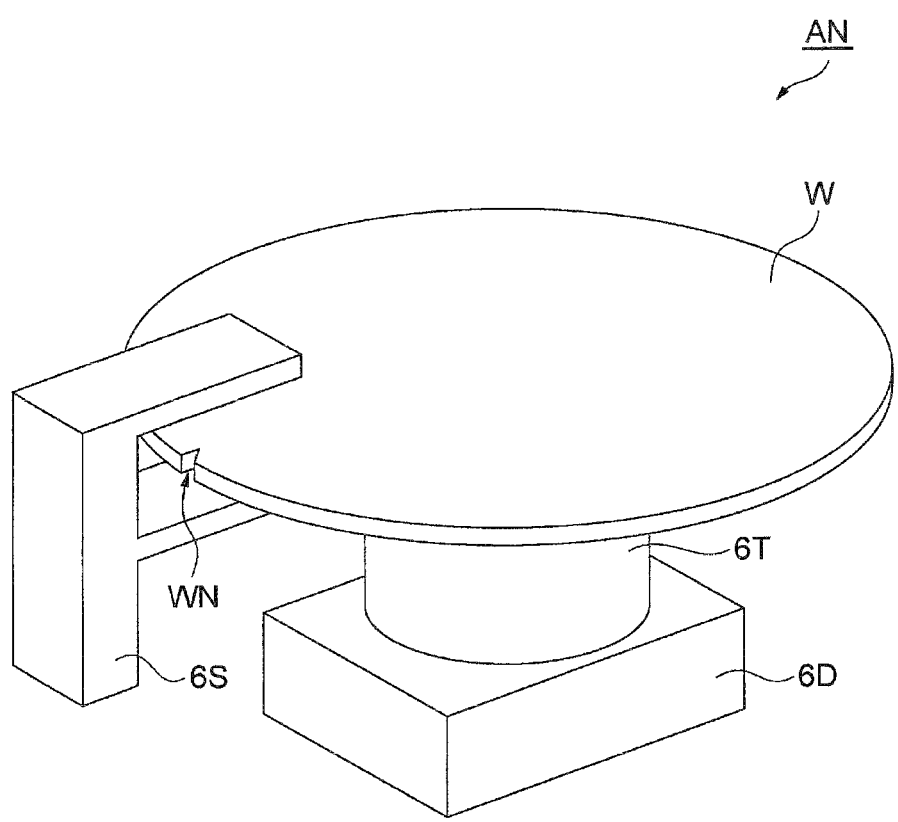
FIG. 4 is a perspective view showing an example of an aligner.

The aligner AN is connected to the loader module LM. The aligner AN is configured to adjust (correct) a position of the workpiece W. FIG. 4 is a perspective view showing an example of an aligner. The aligner AN has a supporting table 6T, a driving unit 6D, and a sensor 6S. The supporting table 6T is a table capable of rotating about an axis line extending in the vertical direction and configured to support thereon the workpiece W. The supporting table 6T is rotated by the driving unit 6D. The driving unit 6D is controlled by the control unit MC. When the supporting table 6T is rotated by power from the driving unit 6D, the workpiece W mounted on the supporting table 6T is also rotated.

The sensor 6S is an optical sensor and detects an edge of the workpiece W during the rotation of the workpiece W. The sensor 6S detects deviation of an angular position of a notch WN (or another marker) of the workpiece W from a reference angular position and deviation of a central position of the workpiece W from a reference position based on the edge detection result. The sensor 6S outputs the deviation of the angular position of the notch WN and the deviation of the central position of the workpiece W to the control unit MC. The control unit MC calculates a rotation amount of the supporting table 6T which will be used for correcting the angular position of the notch WN to the reference angular position based on the deviation of the angular position of the notch WN. The control unit MC controls the driving unit 6D such that the supporting table 6T is rotated by the rotation amount. Accordingly, the angular position of the notch WN can be corrected to the reference angular position. The control unit MC controls a position of an end effector of the transfer unit TU1 at the time of receiving the workpiece W from the aligner AN based on the deviation of the central position of the workpiece W such that the central position of the workpiece W coincides with a predetermined position on the end effector of the transfer unit TU1.

Referring back to FIG. 2, each of the load-lock modules LL1 and LL2 is provided between the loader module LM and the transfer module TF. Each of the load-lock modules LL1 and LL2 provides a preliminary decompression chamber. A gate valve is provided between the load-lock module LL1 and the loader module LM. The preliminary decompression chamber of the load-lock module LL1 and the transfer space of the loader module LM communicate with each other by opening the gate valve and are isolated from each other by closing the gate valve. Another gate valve is provided between the load-lock module LL2 and the loader module LM. The preliminary decompression chamber of the load-lock module LL2 and the transfer space of the loader module LM communicate with each other by opening the gate valve and are isolated from each other by closing the gate valve.

The transfer module TF is connected to the load-lock modules LL1 and LL2 through gate valves, respectively. The transfer module TF provides a depressurizable decompression chamber. In the decompression chamber, a transfer unit TU2 is provided. The transfer unit TU2 is, e.g., a multi-joint robot, and is controlled by the control unit MC. The transfer unit TU2 is configured to transfer the workpiece W between the load-lock modules LL1 and LL2 and the process modules PM1 to PM6, and between two process modules among the process modules PM1 to PM6.

The process modules PM1 to PM6 are connected to the transfer module TF through gate valves. Each of the process modules PM1 to PM6 is a processing apparatus configured to perform a single-purpose process such as plasma processing on the workpiece W. Chambers of the process modules PM1 to PM6 and the decompression chamber of the transfer module TF communicate with each other by opening the gate valves and are isolated from each other by closing the gate valves.

The following is description on a series of operations at the time of processing the workpiece W in the processing system 1. The workpiece W is unloaded from any one of the vessels 4a to 4d and transferred to the aligner AN by the transfer unit TU1 of the loader module LM. Next, the transfer unit TU1 transfers the aligned workpiece W from the aligner AN to one of the load-lock modules LL1 and LL2. Then, a pressure in a preliminary decompression chamber of the load-lock module LL1 or LL2 is decreased to a predetermined pressure. Thereafter, the workpiece W is transferred from the load-lock module LL1 or LL2 to one of the process modules PM1 to PM6 by the transfer unit TU2 of the transfer module TF. The workpiece W is processed in one or more process modules among the process modules PM1 to PM6. Next, the processed workpiece W is transferred from the process module to one of the load-lock modules LL1 and LL2 by the transfer unit TU2. Then, the workpiece W is transferred from the load-lock module LL1 or LL2 to one of the vessels 4a to 4d by the transfer unit TU1.

As described above, the processing system 1 includes the control unit MC. The control unit MC may be a computer including a processor, a storage unit such as a memory, a display unit, an input/output unit, a communication unit or the like. The above-described series of operations of the processing system 1 are realized by controlling the respective components of the processing system 1 by the control unit MC based on a program stored in the storage unit.

Figure 5:
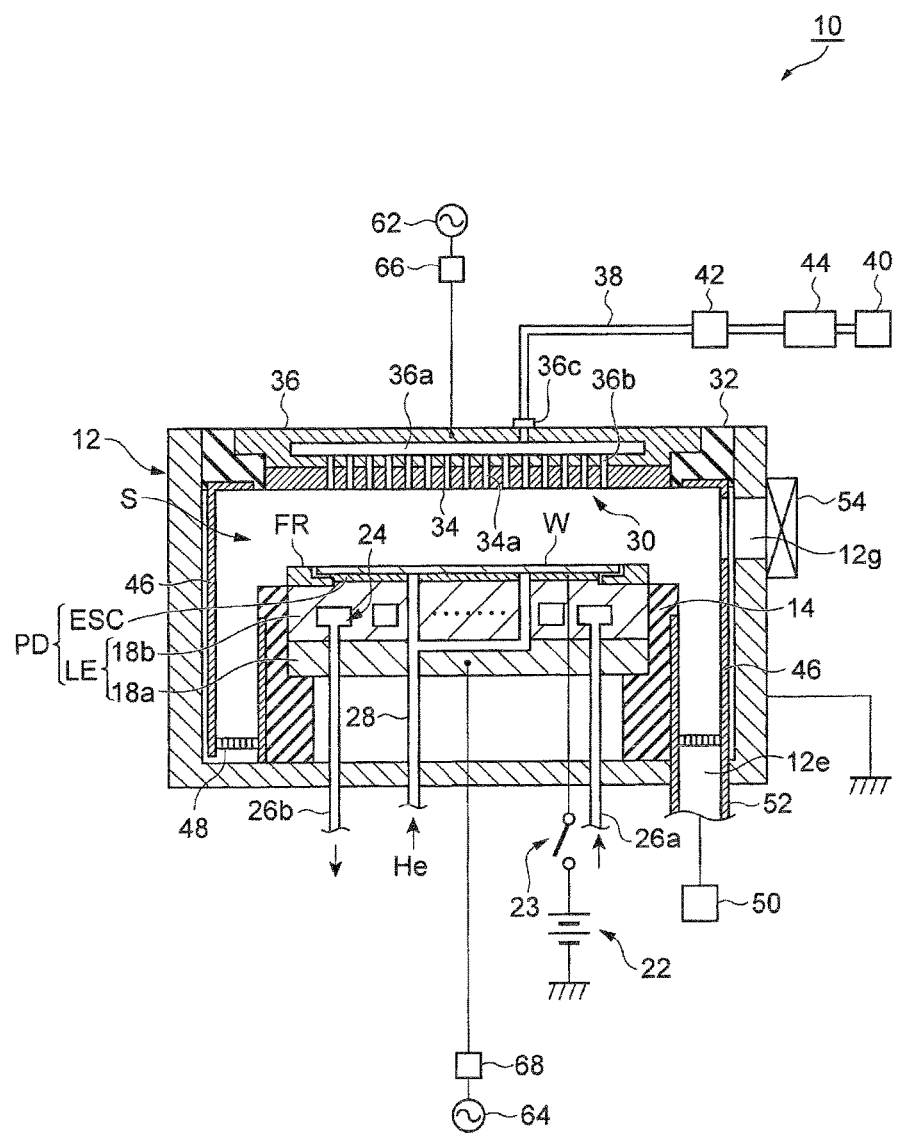
FIG. 5 shows an example of a plasma processing apparatus.

FIG. 5 shows an example of a plasma processing apparatus that may be employed as one of the process modules PM1 to PM6. A plasma processing apparatus 10 shown in FIG. 5 is a capacitively coupled plasma etching apparatus. The plasma processing apparatus 10 includes a substantially cylindrical chamber main body 12. The chamber main body 12 is made of, e.g., aluminum. Anodic oxidation treatment may be performed on an inner wall surface of the chamber main body 12. The chamber main body 12 is frame grounded.

A substantially cylindrical supporting portion 14 is provided on a bottom portion of the chamber main body 12. The supporting portion 14 is made of, e.g., an insulating material. The supporting portion 14 is provided in the chamber main body 12 and extends upward from the bottom portion of the chamber main body 12. In a chamber S defined by the chamber main body 12, a mounting table PD is provided. The mounting table PD is supported by the supporting portion 14.

The mounting table PD includes a lower electrode LE and an electrostatic chuck ESC. The lower electrode LE has a first plate 18a and a second plate 18b. The first plate 18a and the second plate 18b are made of a metal, e.g., aluminum, and has a substantially disk shape. The second plate 18b is provided on the first plate 18a. The second plate 18b is electrically connected to the first plate 18a.

On the second plate 18b, the electrostatic chuck ESC is provided. The electrostatic chuck ESC has a structure in which an electrode that is a conductive film is embedded between two insulating layers or two insulating sheets. The electrostatic chuck ESC has a substantially disk shape. A DC power supply 22 is electrically connected to the electrode of the electrostatic chuck ESC through a switch 23. The workpiece W is attracted and held on the electrostatic chuck ESC by electrostatic force such as Coulomb force or the like which is generated by a DC voltage from the DC power supply 22. Accordingly, the workpiece W can be held on the electrostatic chuck ESC.

A focus ring FR is provided on a peripheral portion of the second plate 18b. The focus ring FR surrounds an edge of the workpiece W and the electrostatic chuck ESC. The focus ring FR has a first portion P1 and a second portion P2 (see FIG. 8). The first portion P1 and the second portion P2 have an annular plate shape. The second portion P2 is disposed on the first portion P1. A diameter of an inner periphery P2i of the second portion P2 is greater than a diameter of an inner periphery P1i of the first portion P1. The workpiece W is mounted on the electrostatic chuck ESC such that the edge region thereof is positioned on the first portion P1 of the focus ring FR. The focus ring FR may be made of a material selected among silicon, silicon carbide, silicon oxide and the like.

A coolant channel 24 is provided in the second plate 18b. The coolant channel 24 constitutes a temperature control mechanism. A coolant is supplied from a chiller unit provided at the outside of the chamber main body 12 into the coolant channel 24 through a line 26a. The coolant supplied into the coolant channel 24 is returned to the chiller unit through a line 26b. The coolant circulates between the coolant channel 24 and the chiller unit. By controlling a temperature of the coolant, a temperature of the workpiece W held on the electrostatic chuck ESC is controlled.

The plasma processing apparatus 10 is provided with a gas supply line 28. The gas supply line 28 supplies a heat transfer gas, e.g., He gas, from a heat transfer gas supply unit to a space between a top surface of the electrostatic chuck ESC and a backside of the workpiece W.

The plasma processing apparatus 10 includes an upper electrode 30. The upper electrode 30 is provided above the mounting table PD to face the mounting table PD. The upper electrode 30 is supported at an upper portion of the chamber main body 12 through an insulating shield member 32. The upper electrode 30 may include a top plate 34 and a holding body 36. The top plate 34 faces the chamber S and a plurality of gas injection holes 34a is formed in the top plate 34. The top plate 34 may be made of silicon or quartz. Or, the top plate 34 may be formed by forming a plasma-resistant film such as an yttrium oxide film on a surface of an aluminum base.

The holding body 36 detachably holds the top plate 34 and may be made of a conductive material, e.g., aluminum. The holding body 36 may have a water-cooling structure. A gas diffusion space 36a is provided in the holding body 36. A plurality of gas holes 36b communicating with the gas injection holes 34a extends downward from the gas diffusion space 36a. A gas inlet port 36c for guiding a processing gas into the gas diffusion space 36a is formed at the holding body 36. A gas supply line 38 is connected to the gas inlet port 36c.

A gas source group 40 is connected to the gas supply line 38 via a valve group 42 and a flow rate controller group 44. The gas source group 40 includes a plurality of gas sources for a plurality of gases. The valve group 42 includes a plurality of valves. The flow rate controller group 44 includes a plurality of flow rate controllers such as mass flow controllers. A plurality of gas sources of the gas source group 40 are connected to the gas supply line 38 via corresponding valves of the valve group 42 and corresponding flow rate controllers of the flow rate controller group 44, respectively.

In the plasma processing apparatus 10, a deposition shield 46 is detachably provided along an inner wall of the chamber main body 12. The deposition shield 46 is also provided at an outer periphery of the supporting portion 14. The deposition shield 46 prevents etching by-products (deposits) from being adhered to the chamber main body 12. The deposition shield 46 may be formed by coating ceramic such as $Y_2O_3$ or the like on an aluminum material.

A gas exhaust plate 48 is provided at a bottom portion in the chamber main body 12 and between the supporting portion 14 and the sidewall of the chamber main body 12. The gas exhaust plate 48 may be formed by coating ceramic such as $Y_2O_3$ or the like on an aluminum material, for example. A plurality of holes is formed in the gas exhaust plate 48 to penetrate therethrough in a thickness direction thereof. A gas exhaust port 12e is provided at the chamber main body 12 to be positioned below the gas exhaust plate 48. A gas exhaust unit 50 is connected to the gas exhaust port 12e through a gas exhaust line 52. The gas exhaust unit 50 includes a vacuum pump such as a pressure control valve, a turbo molecular pump or the like, and thus can decrease a pressure in a space in the chamber main body 12 to a desired vacuum level. A loading/unloading port 12g for the workpiece W is provided at the sidewall of the chamber main body 12. The loading/unloading port 12g can be opened and closed by a gate valve 54.

The plasma processing apparatus 10 further includes a first high frequency power supply 62 and a second high frequency power supply 64. The first high frequency power supply 62 generates a first high frequency power, which has a frequency of, e.g., 27 MHz to 100 MHz, for plasma generation. The first high frequency power supply 62 is connected to the upper electrode 30 via a matching unit 66. The matching unit 66 includes a circuit for matching an output impedance of the first high frequency power supply 62 and an input impedance of the load side (the upper electrode 30 side). The first high frequency power supply 62 may be connected to the lower electrode LE via the matching unit 66.

The second high frequency power supply 64 generates a second high frequency power, which has a high frequency of, e.g., 400 kHz to 13.56 MHz, for attracting ions to the workpiece W. The second high frequency power supply 64 is connected to the lower electrode LE via a matching unit 68. The matching unit 68 includes a circuit for matching an output impedance of the second high frequency power supply 64 and the input impedance of a load side (the lower electrode LE side).

In the plasma processing apparatus 10, a gas from one or more gas sources selected among the gas sources is supplied into the chamber S. A pressure in the chamber S is set to a predetermined pressure by the gas exhaust unit 50. The gas in the chamber S is excited by the first high frequency power from the first high frequency power supply 62. Accordingly, a plasma is generated. The workpiece W is processed by active species. If necessary, ions may be attracted to the workpiece W by the second high frequency power for bias of the second high frequency power supply 64.

Figure 6:
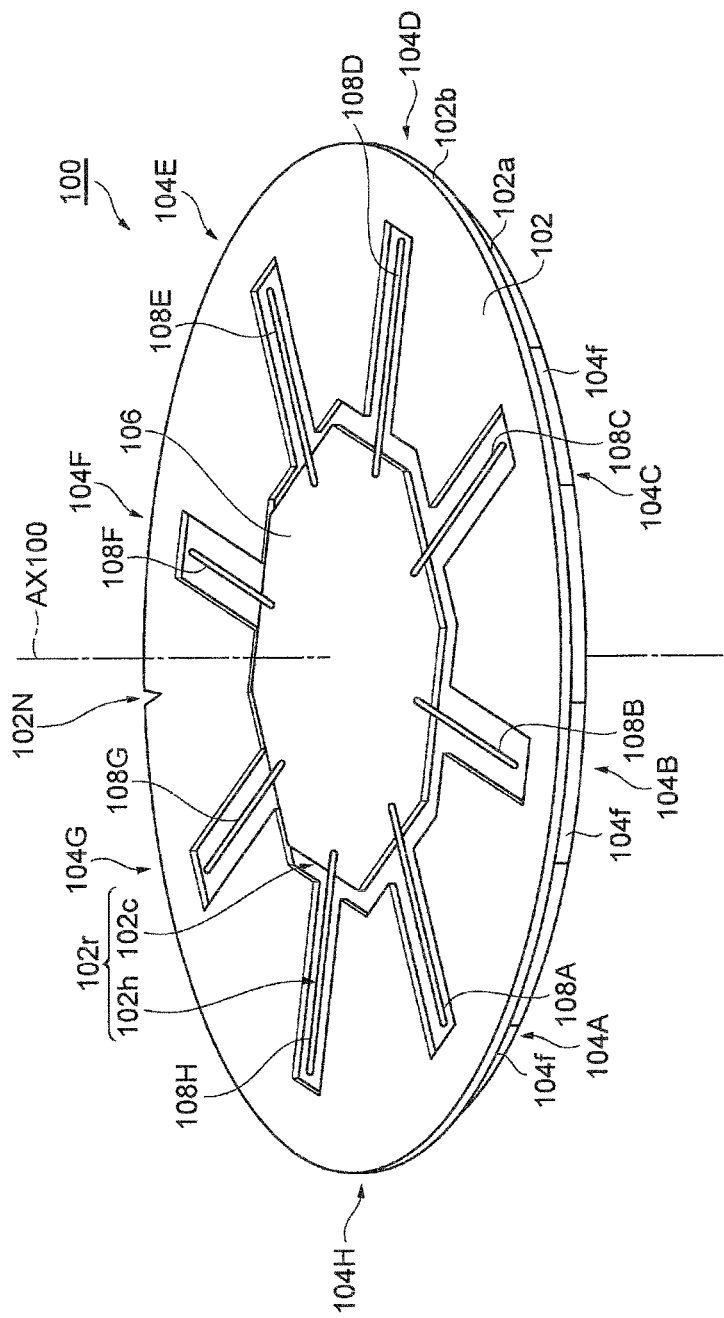
FIG. 6 is a perspective view showing an example of a measuring device.

Hereinafter, the measuring device used in the method MT will be described. FIG. 6 is a perspective view showing an example of the measuring device. A measuring device 100 shown in FIG. 6 includes a base substrate 102. The base substrate 102 is made of, e.g., silicon, and the same shape as that of the workpiece W, i.e., a substantially disc shape. A diameter of the base substrate 102 is the same as that of the workpiece W, e.g., 300 mm. The shape and the size of the measuring device 100 may be determined by the shape and the size of the base substrate 102. Therefore, the measuring device 100 has the same shape and the same size as those of the workpiece W. A notch 102N (or another marker) is formed at an edge of the base substrate 102.

The base substrate 102 has a lower portion 102a and an upper portion 102b. The lower portion 102a is closer to the electrostatic chuck ESC compared to the upper portion 102b when the measuring device 100 is positioned above the electrostatic chuck ESC. A plurality of sensor units 104A to 104H for measuring an electrostatic capacitance is provided at the lower portion 102 of the base substrate 102. The number of sensor units provided at the measuring device 100 may be three or more. The sensor units 104A to 104H are arranged at a regular interval along the edge of the base substrate 102 in the entire circumference of the edge. Specifically, front end surfaces 104f of the sensor units 104A to 104H are provided along the edge of the lower portion 102a of the base substrate 102. In FIG. 6, the sensor units 104A to 104C among the sensor units 104A to 104H are illustrated.

A top surface of the upper portion 102b of the base substrate 102 provides a recess 102r. The recess 102r has a central region 102c and a plurality of radial regions 102h. The central region 102c is a region intersecting with a central axis line AX 100. The central axis line AX 100 is an axis line passing through the center of the base substrate 102 in a thickness direction thereof. A circuit substrate 106 is provided at the central region 102c. The radial regions 102h extend in a radial direction with respect to the central axis line AX from the central region 102c to positions above regions where the sensor units 104A to 104H are provided. Wiring groups 108A to 108H for electrically connecting the sensor units 104A to 104H and the circuit substrate 106 are provided at the radial regions 102h. The sensor units 104A to 104H may be provided at the upper portion 102b of the base substrate 102.

Figure 7:
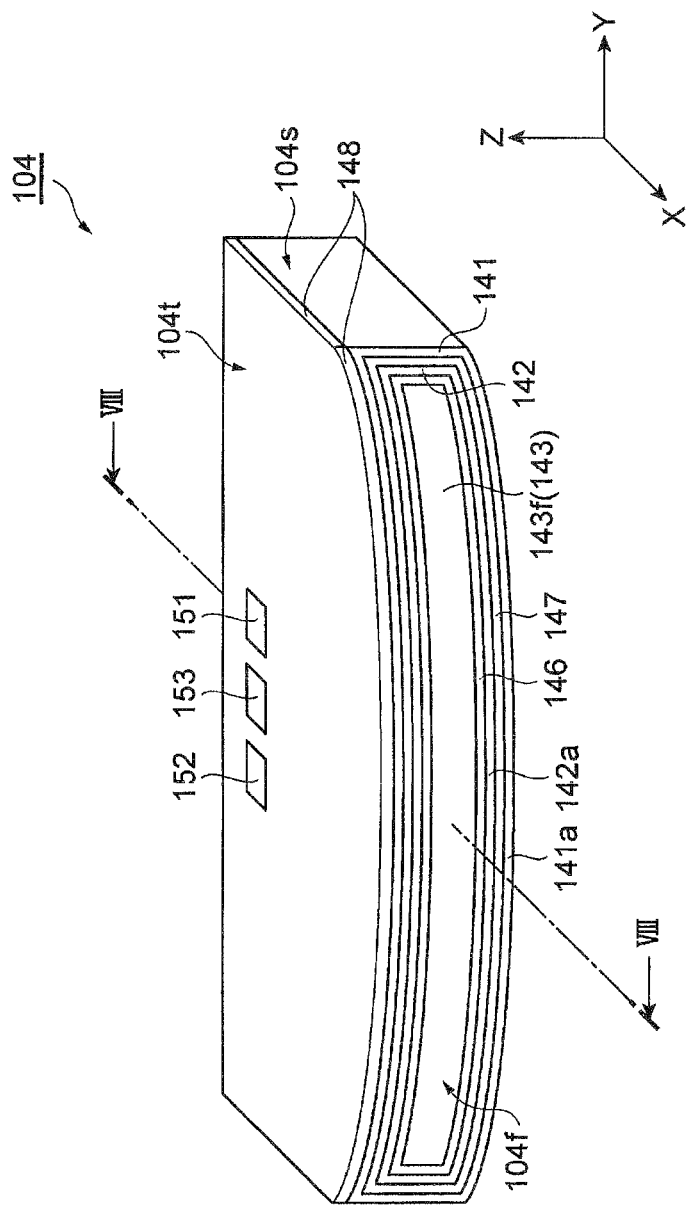
FIG. 7 is a perspective view showing an example of a sensor unit.
Figure 8:
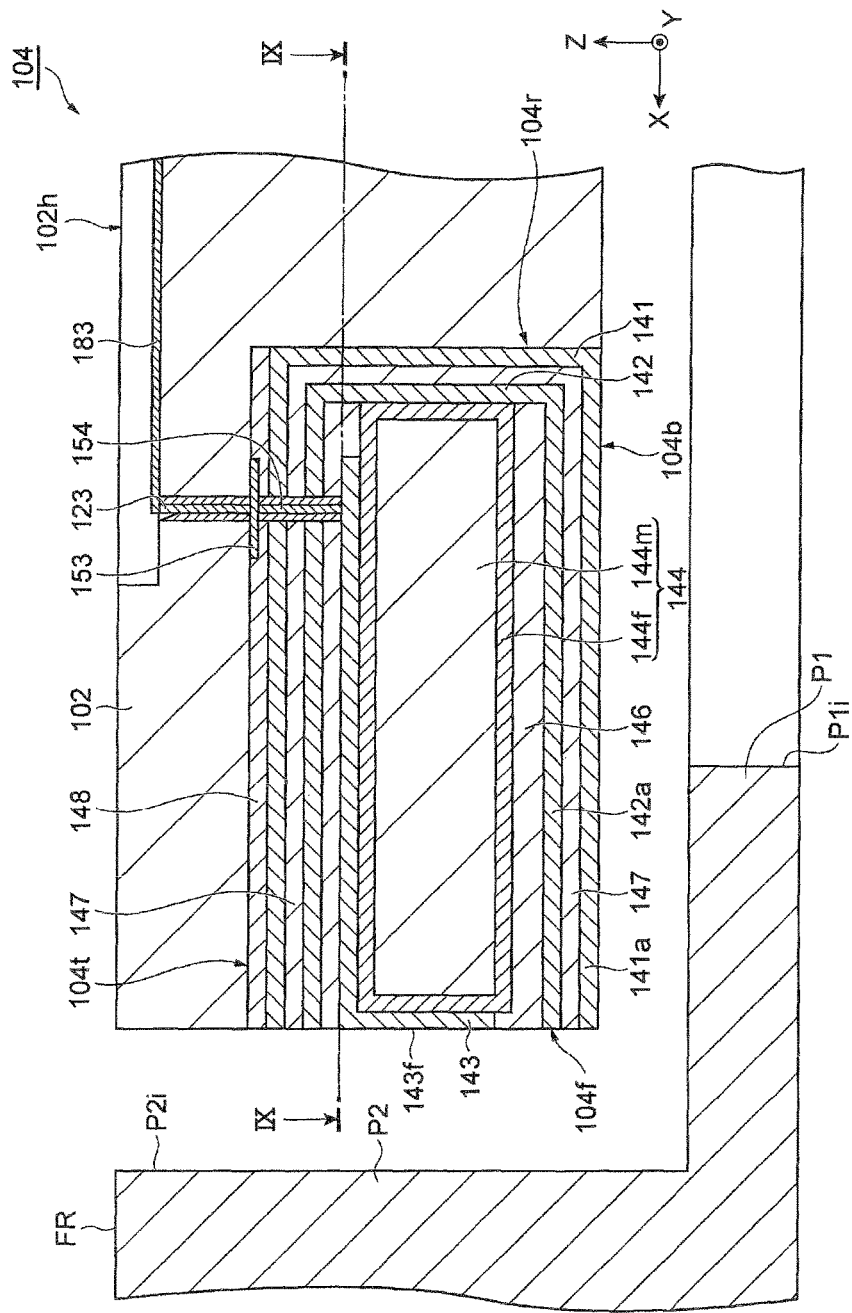
FIG. 8 is a cross sectional view taken along a line VIII-VIII of FIG. 7.
Figure 9:
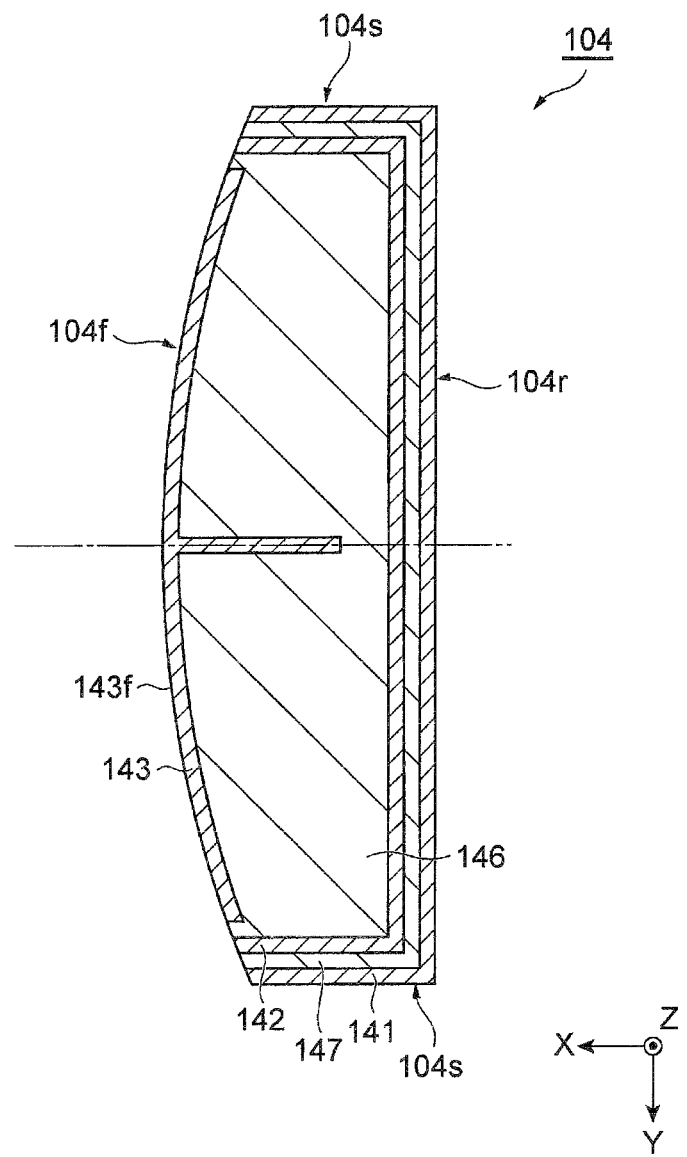
FIG. 9 is a cross sectional view taken along a line IX-IX of FIG. 8.

Hereinafter, the sensor unit will be described in detail. FIG. 7 is a perspective view showing an example of the sensor unit. FIG. 8 is a cross sectional view taken along a line VIII-VIII of FIG. 7. In FIG. 8, the base substrate of the measuring device and the focus ring are illustrated together with the sensor unit. FIG. 9 is a cross sectional view taken along a line IX-IX of FIG. 8. The sensor unit 104 shown in FIGS. 7 to 9 is used as each of the sensor units 104A to 104H of the measuring device 100. In one example, the sensor unit 104 is configured as a chip-shaped component. In the following description, an XYZ orthogonal coordinate system is appropriately referred to. The X direction indicates a frontward direction of the sensor unit 104. The Y direction indicates a width direction of the sensor unit 104 which is orthogonal to the X direction. The Z direction indicates an upward direction of the sensor unit 104 which is orthogonal to the X direction and the Y direction.

As shown in FIGS. 7 to 9, the sensor unit 104 has a front end surface 104f, a top surface 104t, a bottom surface 104b, a pair of side surfaces 104s, and a rear end surface 104r. The front end surface 104f forms a front surface of the sensor unit 104 in the X direction. The sensor unit 104 is mounted on the base substrate 102 of the measuring device 100 such that the front end surface 104f faces in the radial direction with respect to the central axis line AX 100 (see FIG. 6). In a state where the sensor unit 104 is mounted on the base substrate 102, the front end surface 104f extends along the edge of the base substrate 102. Therefore, when the measuring device 100 is mounted on the electrostatic chuck ESC, the front end surface 104f faces an inner periphery of the focus ring FR.

The rear end surface 104r forms a rear surface of the sensor unit 104 in the X direction. When the sensor unit 104 is mounted on the base substrate 102, the rear end surface 104r is positioned near the central axis line AX 100 compared to the front end surface 104f. The top surface 104t forms a top surface of the sensor unit 104 in the Z direction, and the bottom surface 104b forms a bottom surface of the sensor unit 104 in the Z direction.

The sensor unit 104 includes an electrode 143. The sensor unit 104 may further include electrodes 141 and 142. The electrode 141 is made of a conductor. The electrode 141 has a first portion 141a. As shown in FIGS. 7 and 8, the first portion 141a extends in the X direction and the Y direction.

The electrode 142 is made of a conductor. The electrode 142 has a second portion 142a. The second portion 142a extends above the first portion 141a. In the sensor unit 104, the electrode 142 is insulated from the electrode 141. As shown in FIGS. 7 and 8, the second portion 142a extends above the first portion 141a in the X direction and the Y direction.

The electrode 143 is a sensor electrode made of a conductor. The electrode 143 is provided above the first portion 141a of the electrode 141 and the second portion 142a of the electrode 142. The electrode 143 is insulated from the electrodes 141 and 142 in the sensor unit 104. The electrode 143 has a front surface 143f. The front surface 143f extends in a direction intersecting with the first and the second portion 141a and 142a. Further, the front surface 143f extends along the front end surface 104f of the sensor unit 104. In one embodiment, the front surface 143f forms a part of the front end surface 104f of the sensor unit 104. Or, the sensor unit 104 may have an insulating film covering the front surface 143f at the front side of the front surface 143f of the electrode 143.

As shown in FIGS. 7 to 9, the electrodes 141 and 142 open at a side of the front surface 143f of the electrode 143 is provided (X direction) and may extend to surround the electrode 143. In other words, the electrodes 141 and 142 may extend to surround an upper side, a rear side and lateral sides of the electrode 143.

The front end surface 104f of the sensor unit 104 may be a curved surface having a predetermined curvature. In that case, the front end surface 104f has a constant curvature at a certain position thereof. The curvature of the front end surface 104f may be a reciprocal of a distance between the central axis line AX 100 of the measuring device 100 and the front end surface 104f. The sensor unit 104 is mounted on the base substrate 102 such that a curvature center of the front end surface 104f coincides with the central axis line AX 100.

The sensor unit 104 may further include a substrate member 144, insulating regions 146 to 148, pads 151 to 153, and a via wiring 154. The substrate member 144 has a main body 144m and a surface portion 144f. The main body 144m is made of, e.g., silicon. The surface portion 144f covers the surface of the main body 144m. The surface portion 144f is made of an insulating material. The surface portion 144f is, e.g., a thermal oxide film made of silicon.

The second portion 142a of the electrode 142 extends below the substrate member 144. The insulating region 146 is provided between the substrate member 144 and the electrode 142. The insulating region 146 is made of, e.g., $SiO_2$, SiN, $Al_2O_3$, or polyimide.

The first portion 141a of the electrode 141 extends below the substrate member 144 and the second portion 142a of the electrode 142. The insulating region 147 is provided between the electrodes 141 and 142. The insulating region 147 is made of, e.g., $SiO_2$, SiN, $Al_2O_3$, or polyimide.

The insulating region 148 forms the top surface 104t of the sensor unit 104. The insulating region 148 is made of, e.g., $SiO_2$, SiN, $Al_2O_3$, or polyimide. The pads 151 to 153 are formed at the insulating region 148. The pad 153 is made of a conductor and connected to the electrode 143. Specifically, the electrode 143 and the pad 153 are connected to each other through the via wiring 154 penetrating the insulating region 146, the electrode 142, the insulating region 147 and the electrode 141. An insulator is provided around the via wiring 154. The via wiring 154 is insulated from the electrodes 141 and 142. The pad 153 is connected to the circuit substrate 106 through the wiring 123 provided in the base substrate 102 and the wiring 183 provided in the radial region 102h of the recess 102r. The pads 151 and 152 are also made of a conductor. The pads 151 and 152 are connected to the electrodes 141 and 142 through corresponding via wirings, respectively. Further, the pads 151 and 152 are connected to the circuit substrate 106 through corresponding via wirings provided at the base substrate 102 and corresponding wirings provided at the radial region 102h of the recess 102r, respectively.

Figure 10:
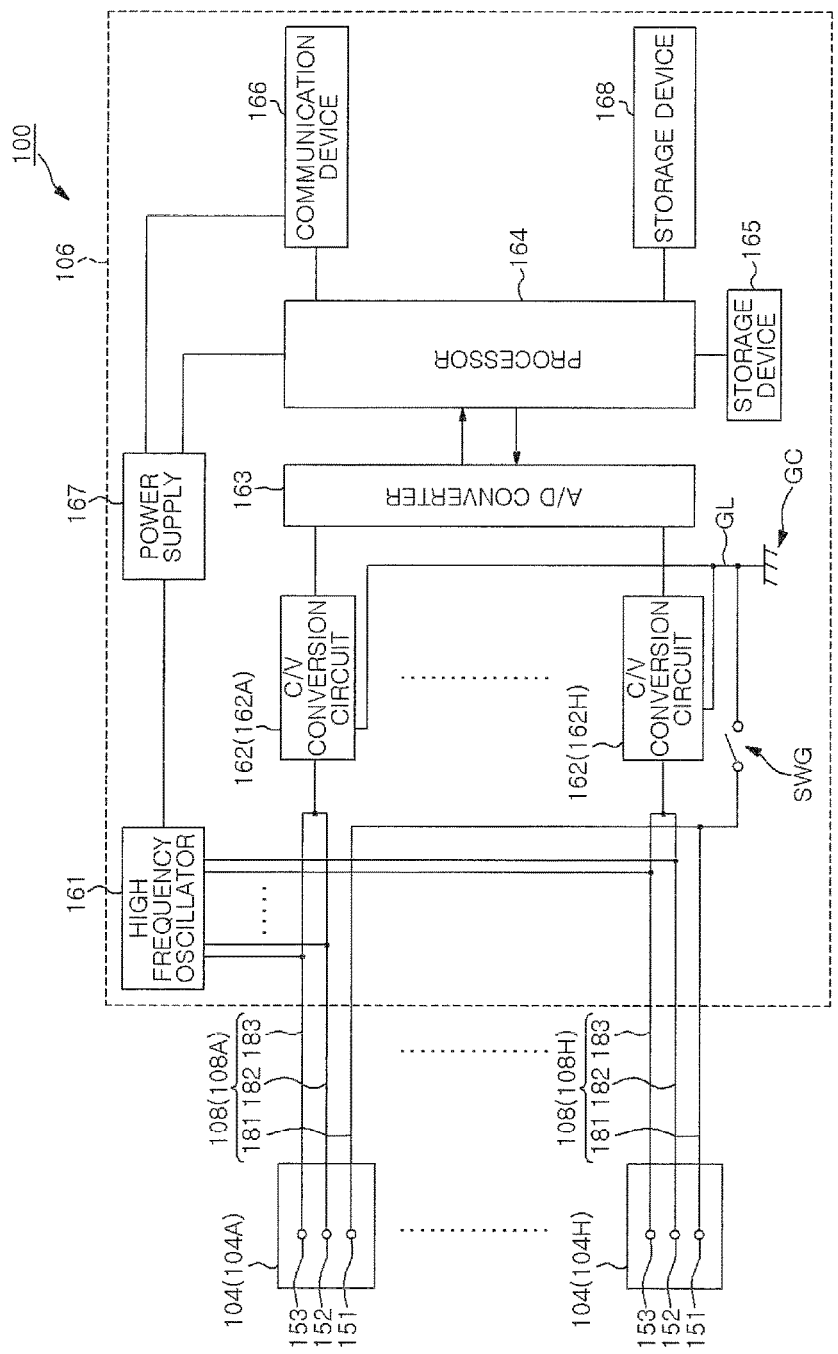
FIG. 10 shows an exemplary configuration of a circuit substrate of the measuring device.

Hereinafter, a configuration of the circuit substrate 106 will be described. FIG. 10 shows an exemplary configuration of the circuit substrate of the measuring device. As shown in FIG. 10, the circuit substrate 106 includes a high frequency oscillator 161, a plurality of C/V conversion circuits 162A to 162H, an A/D converter 163, a processor 164, a storage device 165, a communication device 166, and a power supply 167.

Each of the sensor units 104A to 104H is connected to the circuit substrate 106 through a corresponding wiring group among the wiring groups 108A to 108H. Further, each of the sensor units 104A to 104H is connected to a corresponding C/V conversion circuit among the C/V conversion circuits 162A to 162H through corresponding wirings included in the corresponding wiring group. Hereinafter, a sensor unit 104 having the same configuration as that of each of the sensor units 104A to 104H, a wiring group 108 having the same configuration as that of each of the wiring groups 108A to 108H, and a C/V conversion circuit 162 having the same configuration as that of each of the C/V conversion circuits 162A to 162H will be described.

The wiring group 108 includes wirings 181 to 183. One end of the wiring 181 is connected to the pad 151 connected to the electrode 141. The wiring 181 is connected to a ground potential line GL connected to a ground GC of the circuit substrate 106. The wiring 181 may be connected to the ground potential line GL via a switch SWG. One end of the wiring 182 is connected to the pad 152 connected to the electrode 142, and the other end of the wiring 182 is connected to the C/V conversion circuit 162. One end of the wiring 183 is connected to the pad 153 connected to the electrode 143, and the other end of the wiring 183 is connected to the C/V conversion circuit 162.

The high frequency oscillator 161 is connected to the power supply 167 such as a battery and configured to generate a high frequency signal by receiving the power from the power supply 167. The power supply 167 is also connected to the processor 164, the storage device 165 and the communication device 166. The high frequency oscillator 161 has a plurality of output lines. The high frequency oscillator 161 outputs the high frequency signals to the wirings 182 and 183 through the output lines. Therefore, the high frequency oscillator 161 is electrically connected to the electrodes 142 and 143 of the sensor unit 104, and the high frequency signals from the high frequency oscillator 161 are outputted to the electrodes 142 and 143.

The wirings 182 and 183 are connected to an input of the C/V conversion circuit 162. In other words, the electrodes 142 and 143 of the sensor unit 104 are connected to the input of the C/V conversion circuit 162. The C/V conversion circuit 162 is configured to generate a voltage signal indicating an electrostatic capacitance of the electrode (the electrode 143) connected to the input of the C/V conversion circuit 162 based on a voltage amplitude at the input thereof and output the corresponding voltage signal. As the electrostatic capacitance of the electrode connected to the C/V conversion circuit 162 is increased, the magnitude of the voltage of the voltage signal outputted form the C/V conversion circuit 162 is increased.

Outputs of the C/V conversion circuits 162A to 162H are connected to an input of the A/D converter 163. The A/D converter 163 is also connected to the processor 164. The A/D converter 163 is controlled by the control signal from the processor 164 and converts output signals (voltage signals) of the C/V conversion circuits 162A to 162H to digital values. In other words, the A/D converter 163 generates a digital value indicating an electrostatic capacitance of the electrode 143 and outputs the generated digital value to the processor 164.

The processor 164 is connected to the storage device 165. The storage device 165 is, e.g., a volatile memory, and configured to store measurement data to be described later. The processor 164 is connected to another storage device 168. The storage device 168 is, e.g., a non-volatile memory, and stores a program that is read out and executed by the processor 164. Further, the storage device 168 may store parameters to be described later.

The communication device 166 follows any wireless communication standard. For example, the communication device 166 is based on Bluetooth (Registered Trademark). The communication device 166 is configured to wirelessly transmit the measurement data stored in the storage device 165.

The processor 164 is configured to control the respective components of the measuring device 100 in the method MT by executing the aforementioned program. For example, the processor 164 is configured to control the supply of high frequency signals from the power supply 167 to the electrodes 142 and 143, the supply of power from the power supply 167 to the storage device 165, the supply of power from the power supply 167 to the communication device 166, and the like. Further, the processor 164 is configured to perform the acquisition of digital values, the storage of the measurement data in the storage device 165, the transmission of the measurement data and the like in the method MT by executing the aforementioned program.

In the measuring device 100, the sensor units 104A to 104H are arranged along the edge of the base substrate 102. Therefore, when the measuring device 100 is mounted on the electrostatic chuck ESC, digital values indicating electrostatic capacitances between the focus ring FR and the respective sensor units 104A to 104H can be acquired. The electrostatic capacitance C is expressed by C=∈S/d. ∈ denotes a dielectric constant of a medium between the front surface 143f of the electrode 143 and the inner periphery of the focus ring FR. S denotes an area of the front surface 143f of the electrode 143. d denotes a distance between the front surface 143f of the electrode 143 and the inner periphery of the focus ring FR. Therefore, a plurality of digital values acquired by the measuring device 100 is decreased as the distance between the front surface 143f of the electrode and the inner periphery of the focus ring FR is increased.

As described above, in the sensor unit 104 mounted on the measuring device 100, the electrode 143 (sensor electrode) is provided above the first portion 141a of the electrode 141, and the second portion 142a of the electrode 142 is disposed between the first portion 141a of the electrode 141 and the electrode 143. In the case of using the sensor unit 104, a switch SWG is closed so that a potential of the electrode 141 is set to a ground potential and a high frequency signal is supplied to the electrodes 142 and 143. At this time, the voltage amplitude of the electrode 143 is affected by the electrostatic capacitance in a specific direction, i.e., in a direction (X direction) to which the front surface 143f of the electrode 143 faces, without being affected by the electrostatic capacitance in a direction where the first portion 141a of the electrode 141 is arranged with respect to the electrode 143, i.e., the electrostatic capacitance from the lower portion of the sensor unit 104. Therefore, the sensor unit 104 enables the electrostatic capacitance to be measured with high directivity in the specific direction. When the switch SWG is opened in the case of using the sensor unit 104, the C/V conversion circuit 162 outputs a voltage signal having a voltage corresponding to a combined capacitance of the electrostatic capacitance of the electrode 143 and the electrostatic capacitance of the electrode 142.

The electrodes 141 and 142 open at a side of the region where the front surface of the electrode 143 is provided (X direction) and extend to surround the electrode 143. Therefore, the electrode 143 is shielded by the electrodes 141 and 142 in all direction except a specific direction. Accordingly, the directivity of the sensor unit 104 toward the specific direction can be further improved in measuring the electrostatic capacitance.

The front end surface 104f of the sensor unit 104 is a curved surface having a predetermined curvature, and the front surface 143f of the electrode 143 extends along the front end surface 104f. Therefore, a distance in a diametrical direction between each position of the front surface 143f of the electrode 143 and the inner periphery of the focus ring FR can be set to a substantially equal distance. Accordingly, the measurement accuracy of the electrostatic capacitance is further improved.

Figure 11:
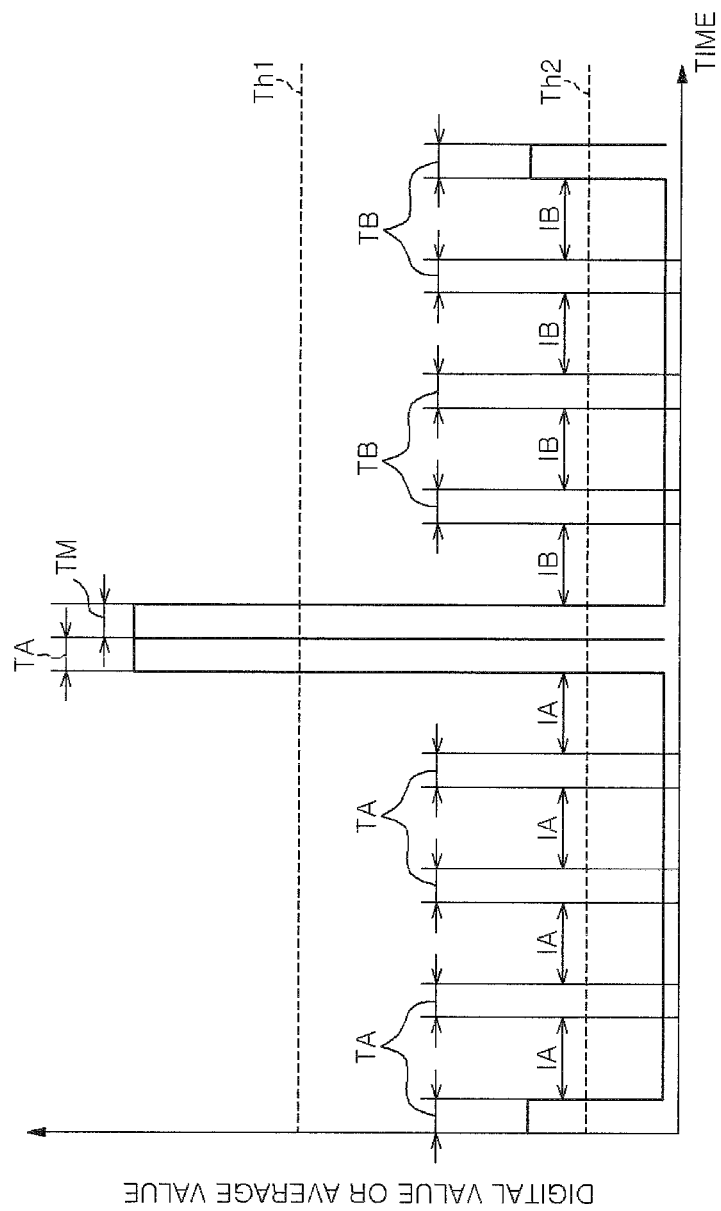
FIG. 11 is a timing chart related to the method shown in FIGS. 1A and 1B.

Hereinafter, the method MT will be described in detail with reference to FIGS. 1A and 1B again. In the following description, FIG. 11 as well as FIGS. 1A and 1B will be referred to. FIG. 11 is a timing chart of the method shown in FIGS. 1A and 1B. As shown in FIG. 1A, in the method MT, first, a step ST1 is executed. In the step ST1, the power supply 167 of the measuring device 100 is set to ON. The processor 164 starts execution of the program stored in the storage device 168. Next, in a step ST2, the measuring device 100 is accommodated in a slot of one of the vessels 4a to 4d.

Next, in a step ST3, parameters are inputted into the measuring device 100. The parameters can be wirelessly transmitted from the control unit MC to the measuring device 100. The measuring device 100 stores the received parameters in the storage device 168. The parameters include a time length TA of a first monitoring period, a time interval IA, a first sampling cycle, a time length TM of a measurement period, a second sampling cycle, a time length TB of a second monitoring period, a time interval IB, a third sampling cycle, a first threshold Th1, and a second threshold Th2. The time length TA, the time interval IA, and the first sampling cycle may be used as the time length TB, the time interval IB, and the third sampling cycle, respectively. In that case, the parameters do not include the time length TB, the time interval IB, and the third sampling cycle. In the method MT, the processing proceeds in parallel. In FIGS. 1A and 1B, two processing flows between two double lines are executed in parallel.

In a step ST4 executed after the step ST3, the measuring device 100 is transferred to the aligner AN by the transfer unit TU1 under the control of the control unit MC. In the aligner AN, the adjustment of the position of the measuring device 100, i.e., the correction of the position of the measuring device 100, is performed under the control of the control unit MC as in the case of adjusting the position of the workpiece W.

Next, in a step ST5, the measuring device 100 is transferred to a region on the mounting table PD which is surrounded by the focus ring FR. Specifically, the measuring device 100 is transferred from the aligner AN to one of the load-lock modules LL1 and LL2 by the transfer unit TU1 under the control of the control unit MC. Then, the measuring device 100 is transferred from the load-lock module LL1 or LL2 to a chamber of one of the process modules PM1 to PM6 by the transfer unit TU2. In the chamber, the measuring unit 100 is positioned in the region on the mounting table PD which is surrounded by the focus ring FR. The transfer destination of the measuring device 100 (position on the mounting table PD) by the transfer unit TU2 is specified by previously set coordinate information. Then, a gate valve between the corresponding process module and the transfer module TF is closed.

In a step ST6 executed after the step ST5, the measuring device 100 is unloaded from the chamber. Specifically, under the control of the control unit MC, the gate valve between the corresponding process module and the transfer module TF is opened. Then, the measuring device 100 is unloaded from the chamber and transferred to one of the load-lock modules LL1 and LL2 by the transfer unit TU2. Next, in a step ST7, the measuring device 100 is accommodated in a slot of one of the vessels 4a to 4d. Specifically, under the control of the control unit MC, the measuring device 100 is transferred from the load-lock module LL1 or LL2 to a slot of one of the vessels by the transfer unit TU1.

In a step ST11 executed after the step ST3, the processor 164 of the measuring device 100 acquires one or more first data sets. The step ST11 is executed during the first monitoring period having the time length TA. The time length TA is not limited and may be, e.g., one second. Each of one or more first data sets acquired in the step ST11 is obtained by allowing the processor 164 to acquire a digital value indicating an electrostatic capacitance of the electrode 143 of the corresponding sensor unit among the sensor units 104A to 104H at the first sampling cycle. The first sampling cycle is not limited and may be, e.g., 0.1 second. All the sensor units 104A to 104H or one or more sensor units specified by the above-described parameters may be employed as the sensor unit used in the step ST11.

Next, in a step ST12, the processor 164 determines whether or not an average of the digital values included in each of one or more first data sets acquired in the step ST11 exceeds the first threshold Th1. When the measuring device 100 is disposed in the region surrounded by the focus ring FR, the electrostatic capacitances of the electrodes 143 of one or more sensor units are increased. Therefore, it is possible to determine whether or not the measuring device 100 is disposed in the region surrounded by the focus ring FT by comparing the first threshold value Th1 and the average of the digital values included in each of one or more data sets. When the processor 164 determines in the step ST12 that the average does not exceed the first threshold value Th1, the processor 164 determines in a step ST13 whether or not the time interval IA has elapsed from the completion of the step ST11. The time interval IA is not limited and may be, e.g., 29 seconds. When the time interval IA has not elapsed from the completion of the step ST11, the processor 164 performs the determination process in the step ST13 again. On the other hand, when the time interval IA has elapsed from the completion of the step ST11, the processor 164 acquires one or more first data sets in the step ST11 again. During the time interval IA, the processor 164 may stop the supply of power from the power supply 167 to the high frequency oscillator 161.

When the processor 164 determines in the step ST12 that the average exceeds the first threshold Th1, the processing proceeds to a step ST14. In the step ST12, the first threshold Th1 may be compared with one or more of the digital values included in each of one or more first data sets, instead of the average.

In the step ST14, the processor 164 acquires a plurality of second data sets. The step ST14 is executed during the measurement period having the time length TM. The time length TM is not limited and may be, e.g., one second. The second data sets acquired in the step ST14 each include a plurality of digital values obtained by acquiring a digital value indicating an electrostatic capacitance of the electrode 143 of the corresponding sensor unit among the sensor units 104A to 104H at the second sampling cycle during the measurement period. The second sampling cycle is not limited and may be, e.g., 0.1 second.

Next, in a step ST15, the processor stores the measurement data in the storage device 165. The measurement data may be a plurality of second data sets. Or, the measurement data may be a plurality of averages obtained by calculating an average of the digital values included in each of the second data sets.

Next, in a step ST16, the processor 164 acquires one or more third data sets. The step ST16 is performed during the second monitoring period having the time length TB. As described above, the time length TB of the second monitoring period may be the same as the time length TA. The third data sets acquired in the step ST16 are respectively obtained by allowing the processor 164 to acquire a digital value indicating an electrostatic capacitance of the electrode 143 of the corresponding sensor unit among the sensor units 104A to 104H at the third sampling cycle. All the sensor units 104A to 104H or one or more sensor units specified by the above-described parameters may be employed as the sensor unit used in the step ST16. The third sampling cycle may be the same as the first sampling cycle.

Next, in a step ST17, the processor 164 determines whether or not an average of the digital values included in each of one or more third data sets acquired in the step ST16 exceeds the second threshold Th2. When the measuring device 100 is accommodated in the slot of any one of the vessels 4a to 4d, the electrostatic capacitances of the electrodes 143 of one or more sensor units are increased. Therefore, it is possible to determine whether or not the measuring device 100 is accommodated in the slot of any one of the vessels 4a to 4d by comparing the second threshold Th2 with the average of the digital values included in each of one or more data sets. The electrostatic capacitance of the electrode 143 obtained when the measuring device 100 is accommodated in the slot of the vessel is smaller than the electrostatic capacitance of the electrode 143 obtained when the measuring device 100 is disposed in the region surrounded by the focus ring FR. Therefore, the second threshold Th2 is smaller than the first threshold Th1.

When the processor 164 determines in the step ST17 that the average does not exceed the second threshold Th2, the processor 164 determines in a step ST18 whether or not the time interval IB has elapsed from the completion of the step ST16. When the time interval IB has not elapsed from the completion of the step ST11, the processor 164 performs the determination process in the step ST18 again. On the other hand, when the time interval IB has elapsed from the completion of the step ST16, the processor 164 acquires one or more third data sets in the step ST16 again. During the time interval IB, the processor 164 may stop the supply of power from the power supply 167 to the high frequency oscillator 161. A time interval between the second monitoring period and a next second monitoring period may be the time interval IA instead of the time interval IB.

When the processor 164 determines in the step ST17 that the average exceeds the second threshold Th2, the processing proceeds to a step ST19. In the step ST17, the second threshold Th2 may be compared with one or more of the digital values included in each of one or more third data sets, instead of the average.

In the step ST19, the processor 164 wirelessly transmits the measurement data stored in the storage device 165 to a receiving unit connected to the control unit MC. When the measurement data is received, the control unit MC corrects the coordinate information of the transfer destination of the transfer unit TU2 in the step ST8. Specifically, the coordinate information is corrected such that the circumferential variation of the gap between the focus ring FT and the edge of the measuring device 100, which is specified by the measurement data, is reduced. When the execution of the step ST19 is finished, the method MT is completed.

As described above, in the method MT, there is used the measuring device 100 including a plurality of electrodes 143 (sensor electrodes) arranged along the edge of the disc-shaped base structure 102, and the measurement data that reflects the circumferential distribution of the gap between the inner periphery of the focus ring FT and the edge of the measuring device 100 is obtained. The digital values indicating the electrostatic capacitances of the electrodes 143 are increased when the measuring device 100 is disposed in the region surrounded by the focus ring FR. In the method MT, the measurement data is not constantly measured. Before the measurement period, one or more first data sets are acquired at the time interval IA. When one or more of the digital values included in each of one or more first data sets or the average of the digital values included in each of one or more first data sets exceeds the first threshold Th1, the second data set is acquired during the measurement period and the measurement data is stored. In the method MT, the measuring device 100 intermittently operates before the measurement period, so that the power consumption of the power supply 167 of the measuring device 100 is decreased.

When one or more of the digital values included in each of one or more third data sets or the average of the digital values included in each of one or more third data sets exceeds the second threshold Th2, the measurement data is wirelessly transmitted to the communication device 166. Accordingly, the measuring device 100 when disposed in the outside of the chamber of the process module can wirelessly transmit the measurement data autonomously. Therefore, the measuring device 100 intermittently operates even after the measurement period. Accordingly, the power consumption of the power supply 167 of the measuring device 100 is further decreased.

Figure 12:
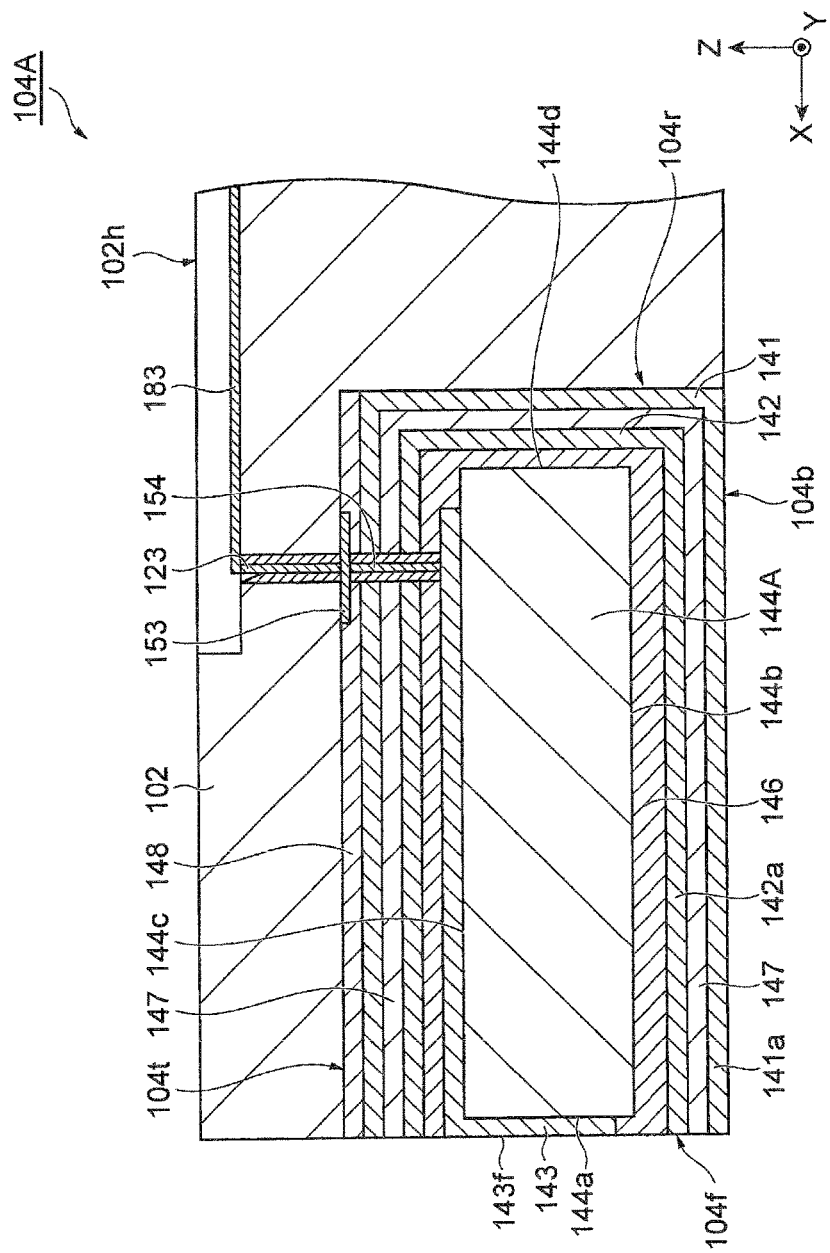
FIG. 12 is a vertical cross sectional view showing another example of the sensor unit.

Hereinafter, another example of the sensor unit that can be installed at the measuring device 100 will be described. FIG. 12 is a vertical cross sectional view showing another example of the sensor unit. A sensor unit 104A shown in FIG. 12 is a modification of the sensor unit 104 and is different from the sensor unit 104 in that a substrate member 144A is provided instead of the substrate member 144. The substrate member 144A is made of an insulating material. For example, the substrate member 144A is made of borosilicate glass. The substrate member 144A may be made of silicon nitride.

The substrate member 144A is a polyhedron having surfaces including a front surface 144a and a bottom surface 144b. In one example, the surfaces of the substrate member 144A further include a top surface 144c, a rear surface 144d, and a pair of side surfaces. The bottom surface 144b and the top surface 144c extend in the X direction and the Y direction and face each other. The front surface 144a forms a front end surface in the X direction of the substrate member 144A and extends in a direction intersecting with the bottom surface 144b. The front surface 144a may have a predetermined curvature. The curvature is a reciprocal of a distance between the central axis line AX 100 and the front surface 144a in the case where the sensor unit 104A is mounted on the base substrate 102. The rear surface 144d forms a rear end surface of the substrate member 144A in the X direction and faces the front surface 144a. A pair of side surfaces extends between one edge in the Y direction of the front surface 144a and one edge in the Y direction of the rear surface 144d and between the other edge in the Y direction of the front surface 144a and the other edge in the Y direction of the rear surface 144d, respectively.

The electrode 143 extends along the front surface 144a and the top surface 144c of the substrate member 144A. The insulating region 146 extends to cover the bottom surface 144b, the top surface 144c, the rear surface 144d and the pair of side surfaces of the substrate member 144A, and the electrode 143 extending on the top surface 144c. The electrode 142 covers the insulating region 146. The second portion 142a of the electrode 142 extends along the bottom surface 144b of the substrate member 144A with the insulating region 146 interposed therebetween. The insulating region 147 extends to cover the electrode 142. The electrode 141 covers the insulating region 147. The first portion 141a of the electrode 141 extends below the second portion 142a of the electrode 142 with the insulating region 147 interposed therebetween.

When the main body 144m of the substrate member 144 of the sensor unit 104 is made of silicon, the sensor unit 104 has an internal electrostatic capacitance. Due to the internal electrostatic capacitance, it is required to set an output of the high frequency oscillator 161 to a high level. On the other hand, in the sensor unit 104A, the substrate member 144A is made of an insulating material and, thus, an internal electrostatic capacitance is very small. Accordingly, in the measuring device 100 having the sensor unit 104A, the output of the high frequency oscillator 161 can be reduced.

Since the measuring device 100 can be used at a temperature range including a high temperature (e.g., 20° C. to 80° C.) and in a depressurized environment (e.g., 1 Torr (133.3 Pa) or less), generation of gas from the substrate member 144A needs to be suppressed. Therefore, the substrate member 144A may be made of borosilicate glass, silicon nitride, quartz, aluminum oxide. By using such substrate member 144A, the generation of gas can be suppressed.

Since the measuring device 100 can be used at a temperature range including a high temperature (e.g., 20° C. to 80° C.), it is preferable that the substrate member 144A has a linear expansion coefficient close to that of a material forming the base substrate 102. Therefore, when the base substrate 102 is made of silicon, the substrate member 144A may be made of, e.g., borosilicate glass or silicon nitride so that the linear expansion coefficient of the substrate member 144A is close to that of the base substrate 102. Accordingly, it is possible to suppress the damage of the sensor unit 104A and the separation of the sensor unit 104A from the base substrate 102 which are caused by the difference between the linear expansion coefficient of the substrate member 144A and that of the base substrate 102.

It is preferable that the measuring device 100 has a small weight. Therefore, it is preferable that the density (mass per unit volume) of the substrate member 144A is close to or smaller than the density of the base substrate 102. Accordingly, when the base substrate 102 is made of silicon, the substrate member 144A may be made of, e.g., borosilicate glass.

Figure 13:
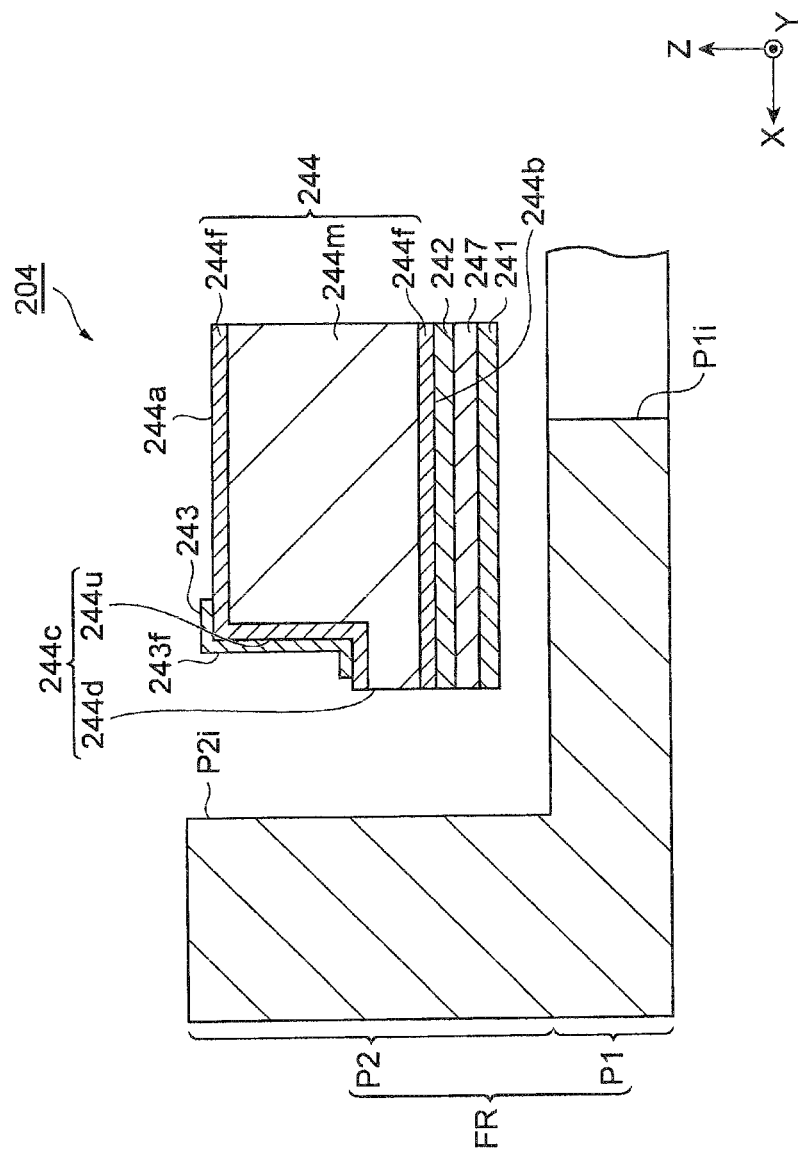
FIG. 13 is a vertical cross sectional view showing still another example of the sensor unit.

Hereinafter, still another example of the sensor unit that can be installed at the measuring device 100 will be described. FIG. 13 is a vertical cross sectional view showing still another example of the sensor unit. In FIG. 13 showing the vertical cross sectional view of the sensor unit 204, the focus ring FR is illustrated together with the sensor unit 204.

The sensor unit 204 includes electrodes 241 to 243. The sensor unit 204 may further include a substrate member 244 and an insulating region 247. The substrate member 244 has a main body 244m and a surface portion 244f. The main body 244m is made of, e.g., silicon. The surface portion 244f covers the surface of the main body 244m. The surface portion 244f is made of an insulating material. The surface portion 244f is, e.g., a thermal oxide film made of silicon.

The substrate member 244 has a top surface 244a, a bottom surface 244b and a front end surface 244c. The electrode 242 is provided below the bottom surface 244b of the substrate member 244 and extends in the X direction and the Y direction. The electrode 241 is provided below the electrode 242 with the insulating region 247 interposed therebetween and extends in the X direction and the Y direction.

The front end surface 244c of the substrate member 244 is formed in a stepped shape. A lower portion 244d of the front end surface 244c projects towards the focus ring FR compared to an upper portion 244u of the front end surface 244c. The electrode 243 extends along the upper portion 244c of the front end surface 244c.

In the case of using the sensor unit 204 as the sensor unit of the measuring device 100, the electrodes 241 to 243 are connected to the wirings 181 to 183, respectively.

In the sensor unit 204, the electrode 243 serving as a sensor electrode is shielded against the lower portion of the sensor unit 204 by the electrodes 241 and 242. Therefore, by using the sensor unit 204, it is possible to measure the electrostatic capacitance with high directivity in a specific direction, i.e., in a direction (X direction) in which the front surface 243f of the electrode 243 faces.

Figure 14:
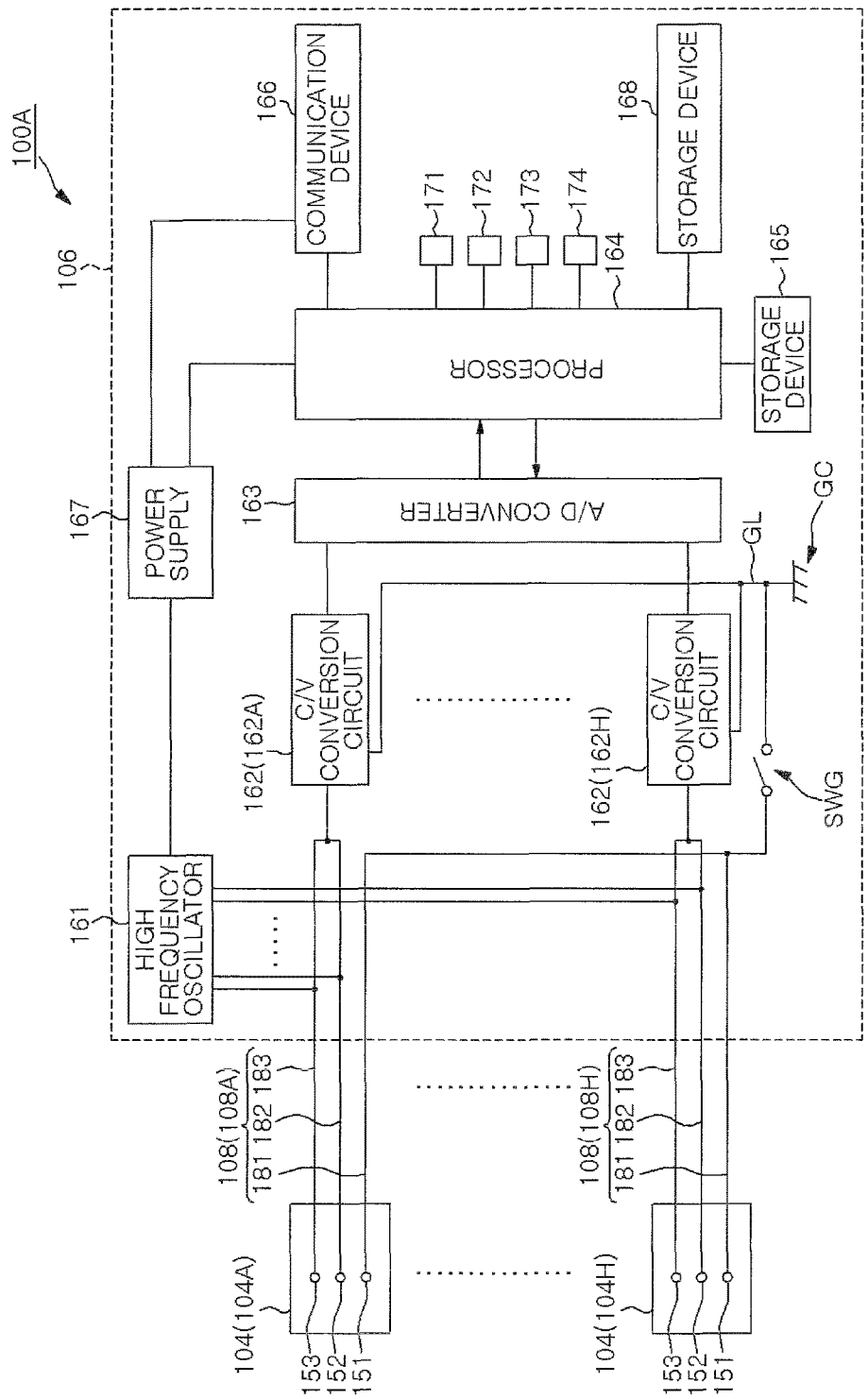
FIG. 14 shows an exemplary configuration of a circuit substrate of a measuring device according to another embodiment.

Hereinafter, a measuring device according to another embodiment will be described. FIG. 14 shows an exemplary configuration of a circuit substrate of the measuring device according to another embodiment. A measuring device 100A shown in FIG. 14 further includes an acceleration sensor 171, a temperature sensor 172, a humidity sensor 173, and a pressure sensor 174, in addition to the same components as those of the measuring device 100. The acceleration sensor 171, the temperature sensor 172, the humidity sensor 173, and the pressure sensor 174 are connected to the processor 164. The acceleration sensor 171 outputs acceleration data indicating a measured acceleration of the measuring device 100A to the processor 164. The temperature sensor 172 outputs temperature data indicating a measured ambient temperature of the measuring device 100A to the processor 164. The humidity sensor 173 outputs humidity data indicating a measured ambient humidity of the measuring device 100A to the processor 164. The pressure sensor 174 outputs pressure data indicating a measured ambient pressure of the measuring device 100A to the processor 164.

The processor 164 performs an abnormality detection process based on the acceleration data, the temperature data, the humidity data and the pressure data. The processor 164 compares the acceleration of the measuring device 100A which is specified by the acceleration data with a threshold of the acceleration. When the acceleration of the measuring device 100A is greater than the threshold of the acceleration, it is determined that abnormality occurs during the transfer of the measuring device 100A and a first signal is wirelessly transmitted to the control unit MC. When it is determined from the acceleration of the measuring device 100 that abnormal vibration occurs in the measuring device 100A, the processor 164 wirelessly transmits a second signal to the control unit MC. When the first or the second signal is received, the control unit MC stops the transfer of the measuring device 100A. The abnormality related to the first signal may occur when the transfer unit TU1 or TU2 is in contact with another tool. The abnormality related to the second signal may occur when operational failure of the transfer unit TU1 or TU2 occurs.

When an angle of the measuring device 100A, which is specified by the acceleration data, is greater than a threshold of the angle, the processor 164 wirelessly transmits a third signal to the control unit MC. The angle of the measuring device 100A indicates levelness of the measuring device 100A and is calculated based on, e.g., the acceleration of the measuring device 100A which is specified by the acceleration data. When the third signal is received, the control unit MC performs control for returning the measuring device 100A to any one of the vessels 4a to 4d. The abnormality related to the third signal may occur when a part of the measuring device 100A is disposed on the focus ring FR.

When the ambient temperature of the measuring device 100A, which is specified by the temperature data, is higher than a threshold value of the temperature, the processor 164 wirelessly transmits a fourth signal to the control unit. When the fourth signal is received, the control unit MC performs control for returning the measuring device 100A. The abnormality related to the fourth signal may occur due to abnormality of a process module that provides a chamber into which the measuring device 100A is loaded.

When the ambient humidity of the measuring device 100A, which is specified by the humidity data, is higher than a threshold of the humidity, the processor 164 wirelessly transmits a fifth signal to the control unit MC. When the fifth signal is received, the control unit MC performs a water-extracting sequence. The water-extracting sequence may be realized by, e.g., evacuation. The abnormality related to the fifth signal may occur due to moisture absorption in the vessels 4a to 4d, the loader module LM, and the load-lock modules LL1 and LL2.

When the ambient pressure of the measuring device 100A, which is specified by the pressure data, is higher than a threshold value of the pressure, the processor 164 wirelessly transmits a sixth signal to the control unit MC. When the sixth signal is received, the control unit MC performs control for evacuation, purging or return of the measuring device 100A. The abnormality related to the sixth signal may occur due to insufficient depressurization in the preliminary decompression chamber of the load-lock module LL1, the preliminary decompression chamber of the load-lock module LL2, the decompression chamber of the transfer module, or the chamber of the process module. Further, the abnormality related to the sixth signal may occur when a gas remains in the chamber of the process module.

In one embodiment, the method MT may further include the above-described abnormality detection process. Upon completion of the step ST3, the abnormality detection process may be performed in parallel with two processes between two double lines shown in FIGS. 1A and 1B. In the abnormality detection process, the control unit MC needs to wirelessly communicate with the measuring device 100A in order to transmit the first to the sixth signal. Therefore, each of the vessels 4a to 4d, the loader module LM, the load-lock modules LL1 and LL2, and the transfer module TF may have a radio wave transmitting window region. Or, each of the inner spaces of the vessels 4a to 4d, the transfer space of the loader module LM, the preliminary decompression chamber of the load-lock module LL1, the preliminary decompression chamber of the load-lock module LL2, and the decompression chamber of the transfer module TF communicates with the radio wave transmitting window region. The measuring device 100A can wirelessly communicate with the control unit MC through the window regions regardless of its installation position selected among the inner spaces of the vessels 4a to 4d, the transfer space of the loader module LM, the preliminary decompression chamber of the load-lock module LL1, the preliminary decompression chamber of the load-lock module LL2, and the decompression chamber of the transfer module TF. When the gate valve between the process module and the transfer module TF is opened, the measuring device 100A provided in the chamber of the corresponding process module can wirelessly communicate with the control unit MC through the window region.

In the above-described abnormality detection process, one or more abnormalities among the above-described abnormalities may be detected. Therefore, the measuring device 100A may include a sensor for detecting abnormality among the acceleration sensor 171, the temperature sensor 172, the humidity sensor 173, and the pressure sensor 174.

While various embodiments have been described, the present disclosure may be variously modified without being limited to the above embodiments. For example, although the plasma processing apparatus has been described as an example of the process modules PM1 to PM6, the process modules PM1 to PM6 may be any processing apparatus as long as the electrostatic chuck and the focus ring are used. Further, although the plasma processing apparatus 10 is configured as a capacitively coupled plasma processing apparatus in the above description, the plasma processing apparatus that can be used as the process modules PM1 to PM6 may be any plasma processing apparatus such as an inductively coupled plasma processing apparatus, a plasma processing apparatus using a surface wave such as a microwave, or the like.

While the disclosure has been shown and described with respect to the embodiments, it will be understood by those skilled in the art that various changes and modifications may be made without departing from the scope of the disclosure as defined in the following claims.

What is claimed is:

1. A method for acquiring data indicating an electrostatic capacitance between a focus ring and a measuring device transferred into a chamber by a transfer unit of a processing system,
wherein the processing system includes:
a process module including a chamber main body that defines the chamber and a mounting table provided in the chamber and on which the measuring device is mounted;
the transfer unit; and
a control unit configured to control the transfer unit,
wherein the measuring device includes:
a disc-shaped base substrate;
a plurality of sensor units arranged along an edge of the base substrate; and
a circuit substrate mounted on the base substrate,
wherein each of the sensor units includes:
a sensor electrode having a front surface extending along the edge of the base substrate,
wherein the circuit substrate includes:
a high frequency oscillator configured to generate a high frequency signal and electrically connected to the sensor electrode of each of the sensor units;
a plurality of C/V conversion circuits each of which is configured to convert voltage amplitude at the sensor electrode of a corresponding sensor unit among the sensor units to voltage signal indicating an electrostatic capacitance;
an A/D converter configured to convert the voltage signal outputted from each of the C/V conversion circuits to a digital value;
a processor connected to the A/D converter;
a storage device connected to the processor;
a communication device configured to wirelessly transmit data stored in the storage device; and
a power supply configured to supply power to the processor, the high frequency oscillator, and the communication device,
the method comprising:
allowing the processor to acquire one or more first data sets at a preset interval, each of said one or more first data sets including a plurality of digital values obtained by acquiring a digital value indicating an electrostatic capacitance of a corresponding sensor unit among the sensor units at a first sampling cycle;
allowing the transfer unit to transfer the measuring device to a region on the mounting table which is surrounded by the focus ring;
allowing the processor to acquire a plurality of second data sets during a measurement period when one or more of the digital values included in each of said one or more first data sets or an average of the digital values included in each of said one or more first data sets exceeds a first threshold value, each of the second data sets including a plurality of digital values obtained by acquiring a digital value indicating an electrostatic capacitance of a corresponding sensor unit among the sensor units at a second sampling cycle during the measurement period;
allowing the processor to store measurement data in the storage device, the measurement data including the second data sets or a plurality of averages obtained by calculating an average of the digital values included in each of the second data sets; and
allowing the transfer unit to unload the measuring device from the chamber.

2. The method of claim 1, further comprising:
allowing the processor to acquire one or more third data sets at a preset time interval after the measurement period is completed, each of said one or more third data sets including a plurality of digital values obtained by acquiring a digital value indicating an electrostatic capacitance of a corresponding sensor unit among the sensor units at a third sampling cycle; and
allowing the processor to wirelessly transmit the measurement data to the communication device when one or more of the digital values included in each of said one or more third data sets or an average of the digital values included in each of said one or more third data sets exceeds a second threshold value.

3. The method of claim 1, wherein the supply of the power from the power supply to the high frequency oscillator is stopped between a period in which said one or more first data sets are acquired and a next period in which said one or more first data sets are acquired.

4. The method of claim 1, wherein the supply of the power from the power supply to the high frequency oscillator is stopped between a period in which said one or more third data sets are acquired and a next period in which said one or more third data sets are acquired.

5. The method of claim 1, wherein in said transferring the measuring device, the control unit controls the transfer unit to transfer the measuring device to a transfer destination specified by preset coordinate information,
the method further comprising:
allowing the control unit to correct the coordinate information such that a circumferential variation of a gap between the focus ring and an edge of the measuring device, which is specified by the measurement data, is reduced.

* * * * *